United States Patent
Chen et al.

(10) Patent No.: US 9,264,181 B2
(45) Date of Patent: Feb. 16, 2016

(54) COMMUNICATION SYSTEM, METHOD AND RECEIVER APPLICABLE THERETO

(71) Applicant: INDUSTRIAL TECHNOLOGY RESEARCH INSTITUTE, Hsinchu (TW)

(72) Inventors: Shiuan-Tung Chen, New Taipei (TW); Hsin-Ta Chiao, Nantou (TW); Shih-Ying Chang, Nantou (TW); Hung-Min Sun, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/489,458

(22) Filed: Sep. 17, 2014

(65) Prior Publication Data

US 2015/0188665 A1    Jul. 2, 2015

(30) Foreign Application Priority Data

Dec. 30, 2013    (TW) .................................. 102149022

(51) Int. Cl.
*H03K 9/00* (2006.01)
*H04L 1/00* (2006.01)
*H03M 13/00* (2006.01)

(52) U.S. Cl.
CPC ............. *H04L 1/0045* (2013.01); *H03M 13/00* (2013.01); *H04L 1/0041* (2013.01); *H04L 1/0056* (2013.01)

(58) Field of Classification Search
CPC .................................................... H04L 1/0045
USPC .......................................................... 375/316
See application file for complete search history.

(56) References Cited

U.S. PATENT DOCUMENTS

| | | | |
|---|---|---|---|
| 7,418,651 B2 | 8/2008 | Luby et al. | |
| 7,532,132 B2 | 5/2009 | Shokrollahi et al. | |
| 7,711,068 B2 | 5/2010 | Shokrollahi et al. | |
| 8,239,727 B2 | 8/2012 | Gao | |
| 8,301,961 B2 | 10/2012 | Yuan et al. | |
| 8,315,306 B2 | 11/2012 | Xu et al. | |
| 8,327,216 B2 | 12/2012 | Abu-Surra | |
| 8,966,339 B1 * | 2/2015 | Lu ................................. | 714/758 |

(Continued)

FOREIGN PATENT DOCUMENTS

| | | |
|---|---|---|
| CN | 1320824 A | 11/2001 |
| CN | 101882972 A | 11/2010 |

(Continued)

OTHER PUBLICATIONS

Michael Luby, "LT Codes", Proceedings of the 43rd Annual IEEE Symposium on Foundations of Computer Science (FOCS'02), 2002, p. 1-10.

(Continued)

*Primary Examiner* — Lihong Yu
(74) *Attorney, Agent, or Firm* — Rabin & Berdo, P.C.

(57) ABSTRACT

A receiver of a communication system includes: an input module, a group-based pre-decoding module and a reconstructing module. The input module is for receiving a received data. The group-based pre-decoding module is for combining the received data with a grouped decoding matrix into an encoded equation matrix (EEM) based on a group parameter and for performing a group operation on the EEM. The reconstructing module is for reconstructing the EEM obtained from the group operation into an output data.

20 Claims, 20 Drawing Sheets

(56) References Cited

U.S. PATENT DOCUMENTS

| | | |
|---|---|---|
| 2006/0161830 A1 | 7/2006 | Yedidia et al. |
| 2009/0055705 A1 | 2/2009 | Gao |
| 2011/0083055 A1 | 4/2011 | Heo et al. |

FOREIGN PATENT DOCUMENTS

| | | |
|---|---|---|
| CN | 102291599 A | 12/2011 |
| CN | 102630011 A | 8/2012 |
| TW | I378650 B | 12/2012 |
| TW | I387247 B | 2/2013 |

OTHER PUBLICATIONS

Amin Shokrollahi, "Raptor Codes", IEEE Transactions on Information Theory, vol. 52, No. 6, Jun. 2006, p. 2551-2567.

Saejoon Kim et al., "Incremental Gaussian Elimination Decoding of Raptor Codes over BEC", IEEE Communications Letters, vol. 12, No. 4, Apr. 2008, p. 307-309.

Saejoon Kim et al., "An Efficient Algorithm for ML Decoding of Raptor Codes over the Binary Erasure Channel", IEEE Communications Letters, vol. 12, No. 8, Aug. 2008, p. 578-580.

J. Heo et al., "Efficient Decoding Algorithm for Raptor Codes for Multimedia Broadcast Services", International Conference on Consumer Electronics 2008. ICCE 2008. Jan. 9-13, 2008, p. 1-2.

Zhang Quan et al., "An Improved Algorithm of 3GPP MBMS Raptor codes", 2010 International Conference on Measuring Technology and Mechatronics Automation, Mar. 13-14, 2010, p. 492-495.

Kwangseok Noh et al., "An Efficient Message Passing Decoding Algorithm for Raptor codes on Hand-Held Consumer Electronics", Jan. 9-13, 2010, p. 213-214.

Todor Mladenov et al., "Implementation and Evaluation of Raptor Codes on Embedded Systems," IEEE Transactions on Computers, vol. 60, No. 12, Dec. 2011.

Taiwanese Office Action dated Sep. 4, 2015.

\* cited by examiner

COMMUNICATION SYSTEM, METHOD AND RECEIVER APPLICABLE THERETO

CROSS-REFERENCE TO RELATED APPLICATION

This application claims the benefit of Taiwan application Serial No. 102149022, filed Dec. 30, 2013, the disclosure of which is incorporated by reference herein in its entirety.

TECHNICAL FIELD

The disclosure relates in general to a communication system, a communication method and a receiver applicable thereto.

BACKGROUND

In recent years, transmitting multimedia on Internet via streaming becomes popular. When a server receives a video/audio request from a user client, the server packs the video/audio files into packets for transmitting to the user client one by one. The user client may view the beginning of the video/audio files in several seconds and then judge whether the video/audio files is desired or not. Further, the user client may view the video on demand (VOD) and even may view the video/audio files in forward or reverse directions by a faster rate. As for the content provider, because it is difficult for the user client to copy the video/audio files, the copy right of the video/audio files is protected. Due to development of broadband Internet, the streaming media will be one main video/audio transmission technique in future.

More and more users watch streaming media in a mobile environment. As for wireless signal transmission/reception, how to receive wireless signals stably is a challenge, especially in a highly mobile environment. That is because of bit error or packet lost. Forward Error Correction (FEC) is used to restore data or recover lost packets, thus improving data transmission and reception.

During wireless signal transmission and reception, signal encoding/decoding rate will have influence on the efficiency of the communication system.

Thus, the disclosure provides a communication system, a communication method and a receiver applicable thereto which improves decoding rates and thus improves the efficiency of the communication system.

SUMMARY

The disclosure is directed to a method of a communication system, a communication method and a receiver applicable thereto. A decoding matrix is pre-processed and group parameters are obtained to improve decoding efficiency of the receiver.

According to one embodiment, a receiver for a communication system. The receiver includes: an input module, a group-based pre-decoding module and a reconstructing module. The input module is for receiving a received data. The group-based pre-decoding module is for combining the received data received by the input module with a grouped decoding matrix to obtain an encoded equation matrix based on a group parameter, and for performing a group operation on the encoded equation matrix. The reconstructing module is for reconstructing the encoded equation matrix obtained from the group operation into an output data.

According to another embodiment, a communication method is provided. A decoding matrix is grouped based on a block length of an input data. An area operation is performed on the grouped decoding matrix for generating a group parameter, based on the block length of the input data. A received data is combined with the grouped decoding matrix to obtain an encoded equation matrix based on the group parameter. A group operation is performed on the encoded equation matrix to decode the received data into an output data.

According to yet another embodiment, a communication system is provided. The communication system includes a sender and a receiver. The sender is for grouping and sending a plurality of contents of an input data based on a block length of the input data. The receiver is for receiving a received data from the sender. The receiver includes: a group-based pre-decoding module and a reconstructing module. The group-based pre-decoding module is for combining the received data with a grouped decoding matrix to obtain an encoded equation matrix based on a group parameter, and for performing a group operation on the encoded equation matrix. The reconstructing module is for reconstructing the encoded equation matrix obtained from the group operation into an output data.

BRIEF DESCRIPTION OF THE DRAWINGS

FIG. 3 shows that the sender generates intermediate symbols IMS and repair symbols RS.

FIG. 11 shows elimination of the right-bottom of the matrix in FIG. 10 by a general Gaussian elimination.

Figure 1:
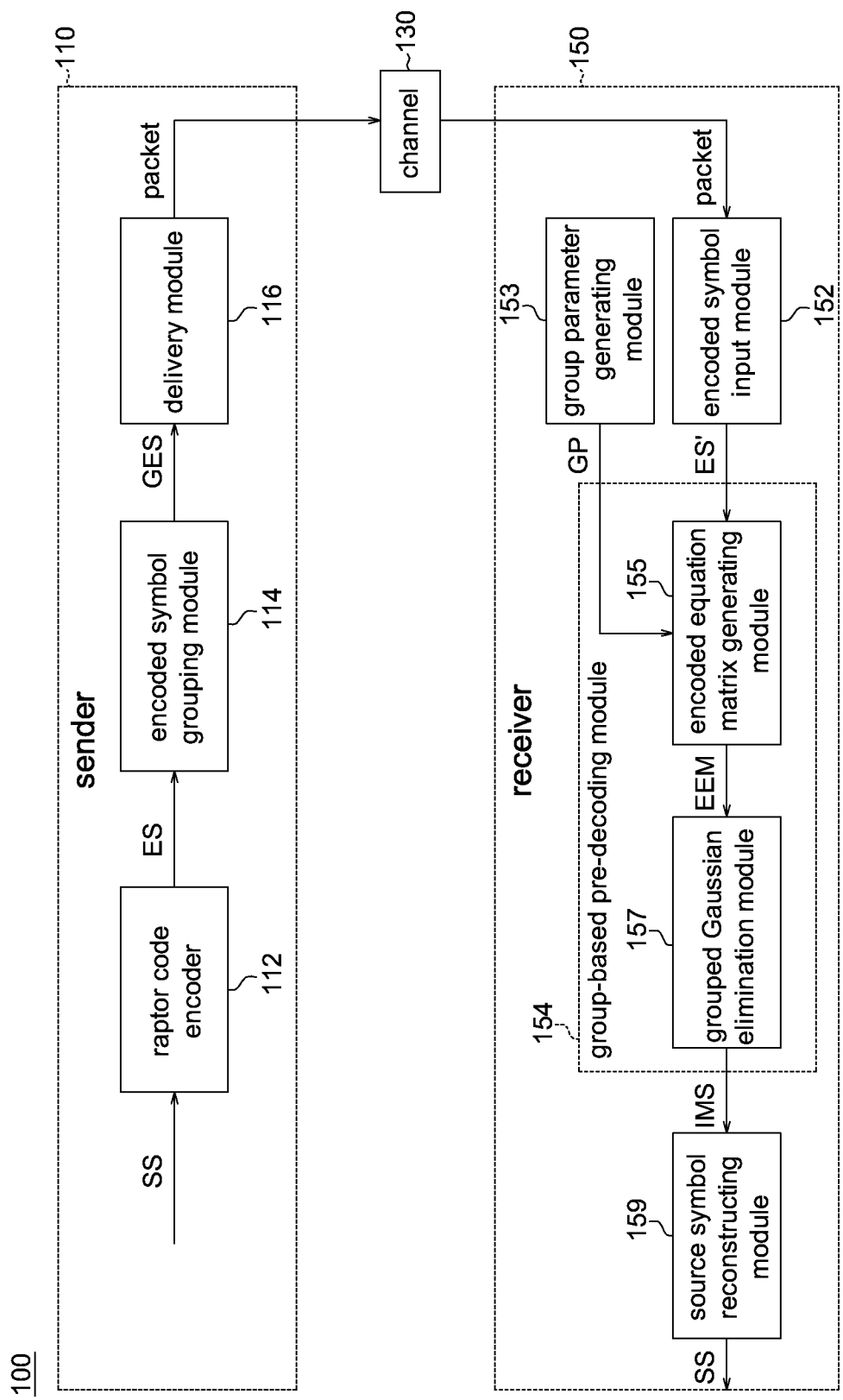
FIG. 1 shows a functional block diagram for a communication system according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field of the disclosure. If the disclosure describes or explains one or some terms, definition of the terms are based on the description or explanation of the disclosure. Description of common techniques or principles of this field are omitted if they are not related features of the disclosure. Further, shapes, sizes and ratios of the objects are exemplary for one skilled person in the art to understand the disclosure, not to limit the disclosure.

Each of the disclosed embodiments has one or more technical features. In possible implementation, one skilled person in the art would selectively implement part or all technical features of any embodiment of the disclosure or selectively combine part or all technical features of the embodiments of the disclosure.

In embodiments of the disclosure, a receiver groups the matrixes (for example, the encoding matrix A and the triple vector T) and an area operation (for example but not limited by, a Gaussian elimination operation) is performed on the groups to generate group parameters in advance. When the receiver receives enough data, a group operation (for example but not limited by, a grouped Gaussian elimination operation) is performed based on the grouping result and the group parameters.

Now please refer to FIG. 1, a functional block diagram for a communication system according to one embodiment of the disclosure is shown. As shown in FIG. 1, a communication system 100 includes: a sender 110 and a receiver 150. The sender 110 and the receiver 150 sends/receives data to/from each other via a channel 130. The channel 130 is for example but not limited by, air or a signal line.

The sender 110 includes: a raptor code encoder 112, an encoded symbol grouping module 114 and a delivery module 116.

The receiver 150 includes: an encoded symbol input module 152, a group parameter generating module 153, a group-based pre-decoding module 154 and a source symbol reconstructing module 159. The group-based pre-decoding module 154 includes: an encoded equation matrix generating module 155 and a grouped Gaussian elimination module 157.

In the sender 110, the raptor code encoder 112 generates encoded symbols ES from source symbols SS. In details, the raptor code encoder 112 multiplies the source symbols SS by the inverse matrix of the encoded matrix A to generate intermediate symbols IMS and multiplies the intermediate symbols IMS by the triple vector T to generate repair symbols RS. The encoded symbols ES are union of the source symbols SS and the repair symbols RS.

The encoded symbol grouping module 114 groups the encoded symbols ES into grouped encoded symbols GES. The delivery module 116 delivers grouped encoded symbols GES in packets on the channel 130. For example, the delivery module 116 delivers the packets in the grouping sequence. If the transmission characteristic of the channel 130 has a high chance in burst packet loss, then this delivery enhances decoding efficiency of the decoder. That is to say, the encoded symbols ES are packed into to a series of packets. Therefore, the packets of the same group may be delivered in series. In other words, during delivery, the packets carrying the encoded symbols ES of the same group are delivered serially without any other encoded symbols ES of other group delivered in between. By so, a better error resistance performance is achieved.

The receiver 150 transforms the packets received on the channel into received encoded symbols ES'. Internal operations of the encoded symbol input module 152 depend on the employed transmission protocol.

The group parameter generating module 153 generates and outputs group parameters GP to the group-based pre-decoding module 154. Details of generation of the group parameters GP will be described later. The group parameter generating module 153 groups the matrixes (for example, the encoding matrix A and the triple vector T) based on a block length of an input data and performs an area operation (for example but not limited by, a Gaussian elimination operation) to generate group parameters.

The group-based pre-decoding module 154 recovers the intermediate symbols IMS from the received encoded symbols ES'. If the packet loss is not serious, the group-based pre-decoding module 154 may recover the intermediate symbols IMS completely.

The source symbol reconstructing module 159 reconstructs the source symbols SS from the recovered intermediate symbols IMS.

The encoded equation matrix generating module 155 of the group-based pre-decoding module 154 generates encoded equation matrix EEM from the received encoded symbols ES'; and the grouped Gaussian elimination module 157 performs a grouped Gaussian elimination on the encoded equation matrix EEM to obtain the intermediate symbols IMS. Details of the group-based pre-decoding module 154 are described later.

Figure 2A:
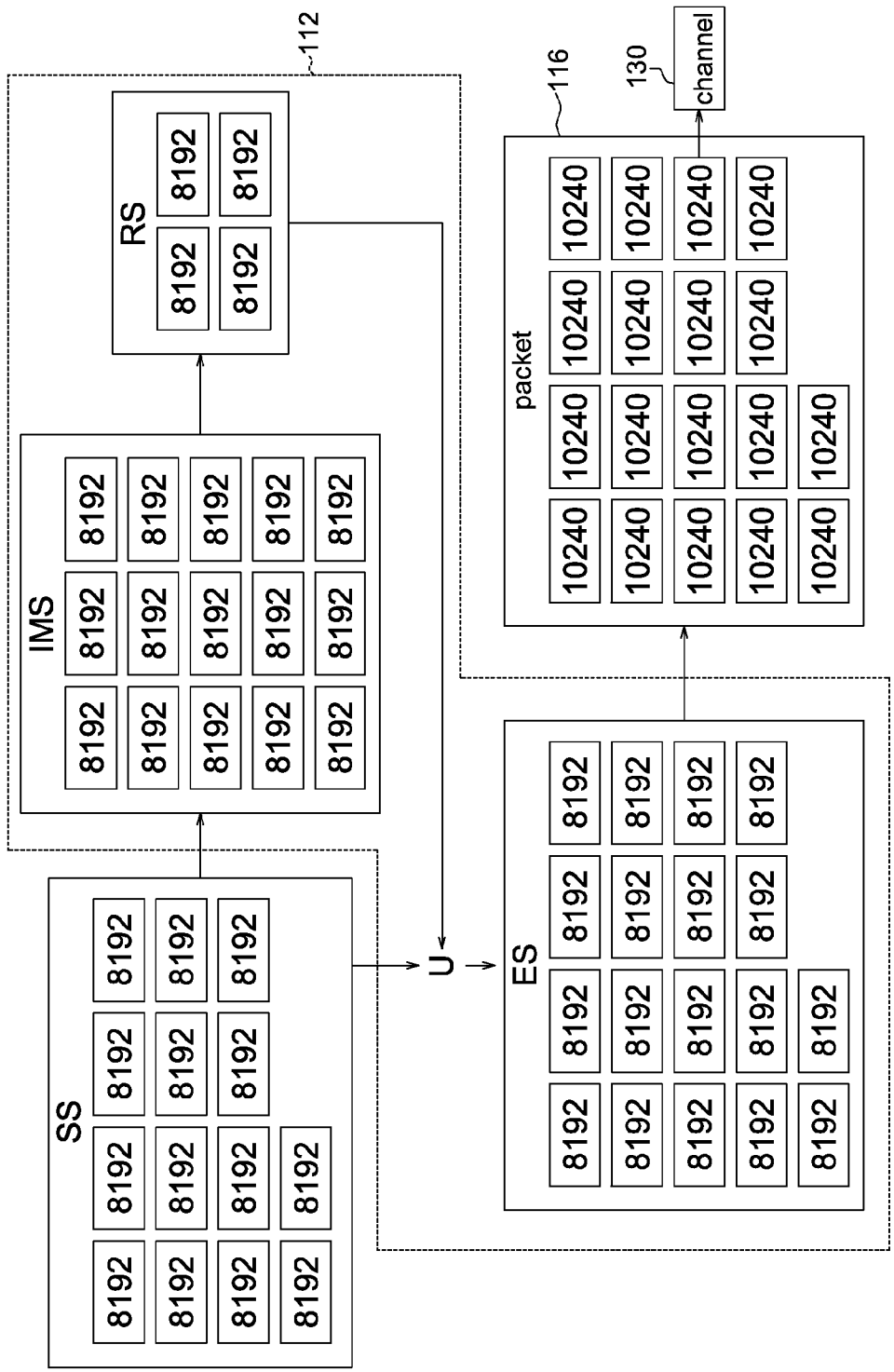
FIG. 2A and FIG. 2B show operations of a sender and a receiver in FIG. 1, respectively.
Figure 2B:
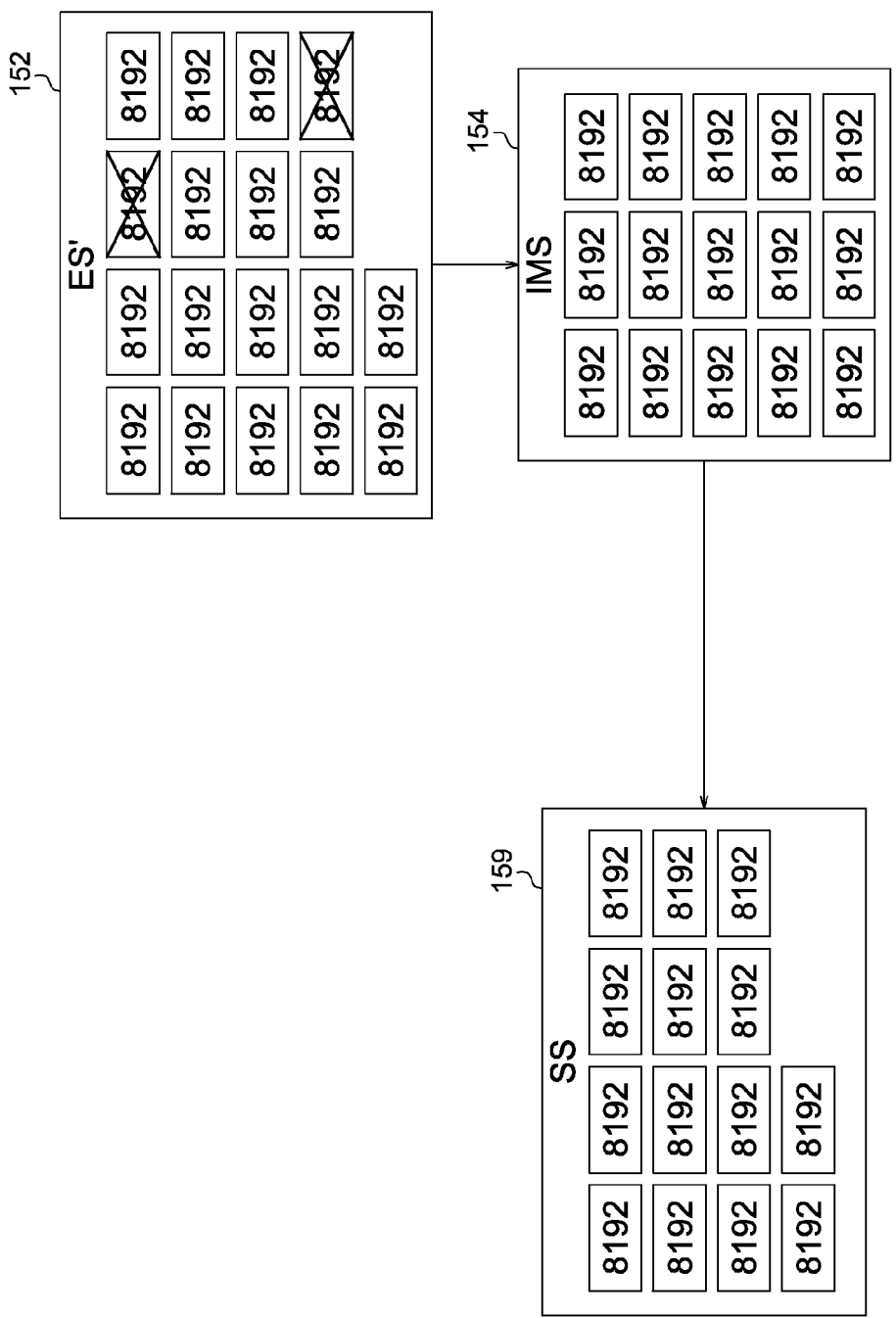

FIG. 2A and FIG. 2B show operations of the sender 110 and the receiver 150. In FIG. 2A, it is assumed that data to be delivered includes 14 source symbols SS each including 8192 bits. The raptor code encoder 112 generates 15 intermediate symbols IMS (each including 8192 bits) and 4 repair symbols RS (each including 8192 bits). Number of the repair symbols RS may be changed based on the network status. For example, if the network status is not stable, then the number of the repair symbols RS may be higher for repairing the source symbols SS.

The raptor code encoder 112 performs union operation on the 14 source symbols SS and the 4 repair symbols RS into 18 encoded symbols ES each including 8192 bits. For example, in the 18 encoded symbols ES, the first 14 encoded symbols ES are the 14 source symbols SS and the last 4 encoded symbols ES are the 4 repair symbols RS. After grouping by the encoded symbol grouping module 114, the delivery module 116 delivers the 18 encoded symbols ES in packets (each packet including 10240 bits) onto the channel 130 based on protocol of the sender 110.

Now refer to FIG. 2B. It is assumed that when the encoded symbol input module 152 of the receiver 150 receives data from the channel 130, the third encoded symbol ES and the sixteenth encoded symbol ES are lost. Therefore, the encoded symbol input module 152 receives 16 received encoded symbols ES' each including 8192 bits. The group-based pre-decoding module 154 recovers 15 intermediate symbols IMS (each including 8192 bits) from the 16 received encoded symbols ES' and the source symbol reconstructing module 159 reconstructs 14 source symbols SS (each including 8192 bits) from the 15 intermediate symbols IMS.

Figure 3:
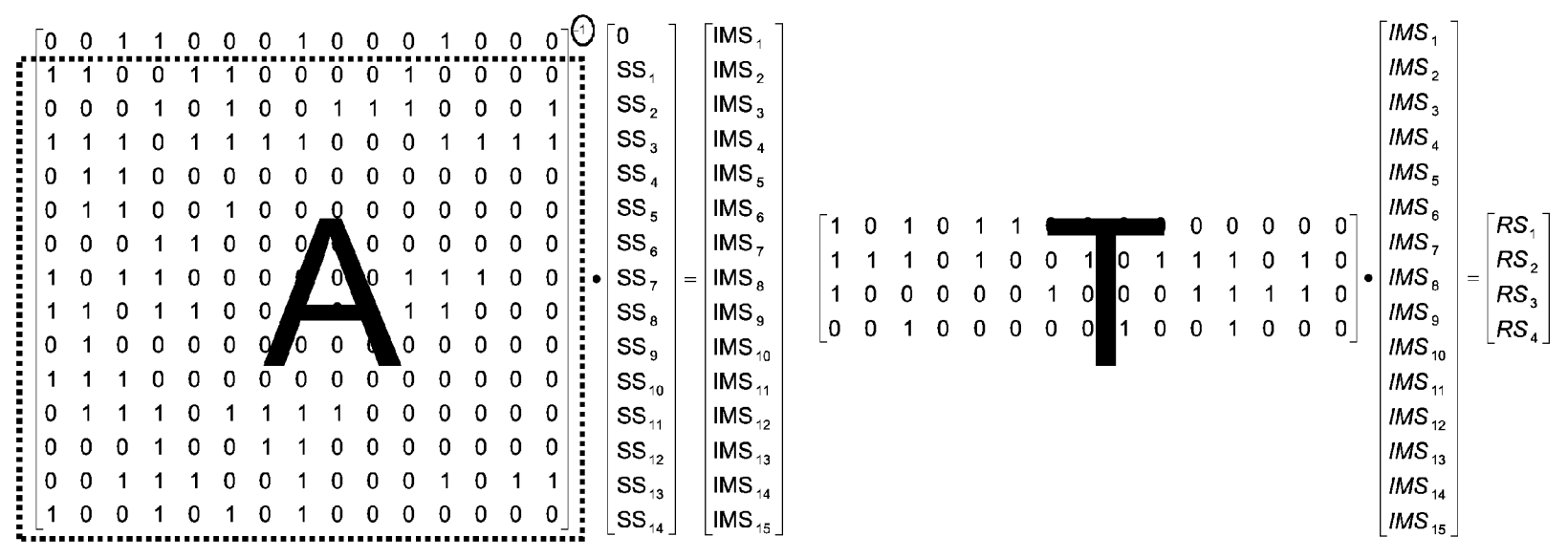

FIG. 3 shows that the sender generates the intermediate symbols IMS and the repair symbols RS. As shown in FIG. 3, the sender multiplies the source symbols SS by the inverse matrix of the encoded matrix A to generate the intermediate symbols IMS, and multiplies the intermediate symbols IMS by the triple vector T to generate the repair symbols RS.

In the standard, if the number of the source symbols is known, then the formation and content of the encoded matrix A and the triple vector T are also determined.

During decoding, it takes time to recover the intermediate symbols IMS from the received encoded symbols ES' because in tradition, an inverse matrix is used in recovering the intermediate symbols IMS from the received encoded symbols ES' and it takes time in generating the inverse matrix.

Thus, in the embodiment of the disclosure, the group parameter generating module 153 and the group-based pre-decoding module 154 are used in acceleration of decoding, without direct generation of the inverse matrix. Now, how the group-based pre-decoding module 154 is used in acceleration of decoding is described.

The sender 110 informs the receiver 150 about the number of the source symbols SS (i.e. a block length parameter k) of data and thus the receiver 150 identifies content of the encoded matrix A and the triple vector T used by the sender 110 in sending data.

Decoding of the receiver 150 includes two stages. First stage is a pre-decoding operation and the second stage is a LT-coding (Luby Transform coding). The first stage (i.e. the pre-decoding) takes a lot of time cost in the decoding. Thus, the embodiment of the disclosure shortens the pre-decoding time to improve the overall decoding efficiency.

In pre-decoding, a Gaussian elimination is used to recover the intermediate symbols IMS from the received encoded symbols ES'. If the receiver 150 does not know the content of the encoded symbols ES in advance, the receiver 150 does not perform Gaussian elimination operation in advance. For this, in the embodiment of the disclosure, the encoded matrix A and the triple vector T are grouped in appropriate groups and an area Gaussian elimination is performed in each group in advance to generate optimized group parameters GP. During grouping, the sender and the receiver communicate with each other and thus the sender and the receiver may use the same group policy.

If the group is too large, the probability of sending the whole group completely is reduced. On the contrary, if the group is too small, the number of operations which may be performed in advance may be fewer.

Now, the group parameters which are used in generating the intermediate symbols IMS are described. In the embodiment of the disclosure, the group parameter GP includes: a group identification (ID) which identifies the identification of the group; an encoded symbol ID identifying which encoded symbols ES are included in the group; encoded group row vectors which record the result obtained by performing the area Gaussian elimination operation on the decoding matrixes (the encoded matrix A and the triple vector T); an encoded group operation (OP) list which records the list of operations used in the area Gaussian elimination operation; and an encoded group column list which records the result of rearranging columns of the decoding matrixes.

Figure 4:
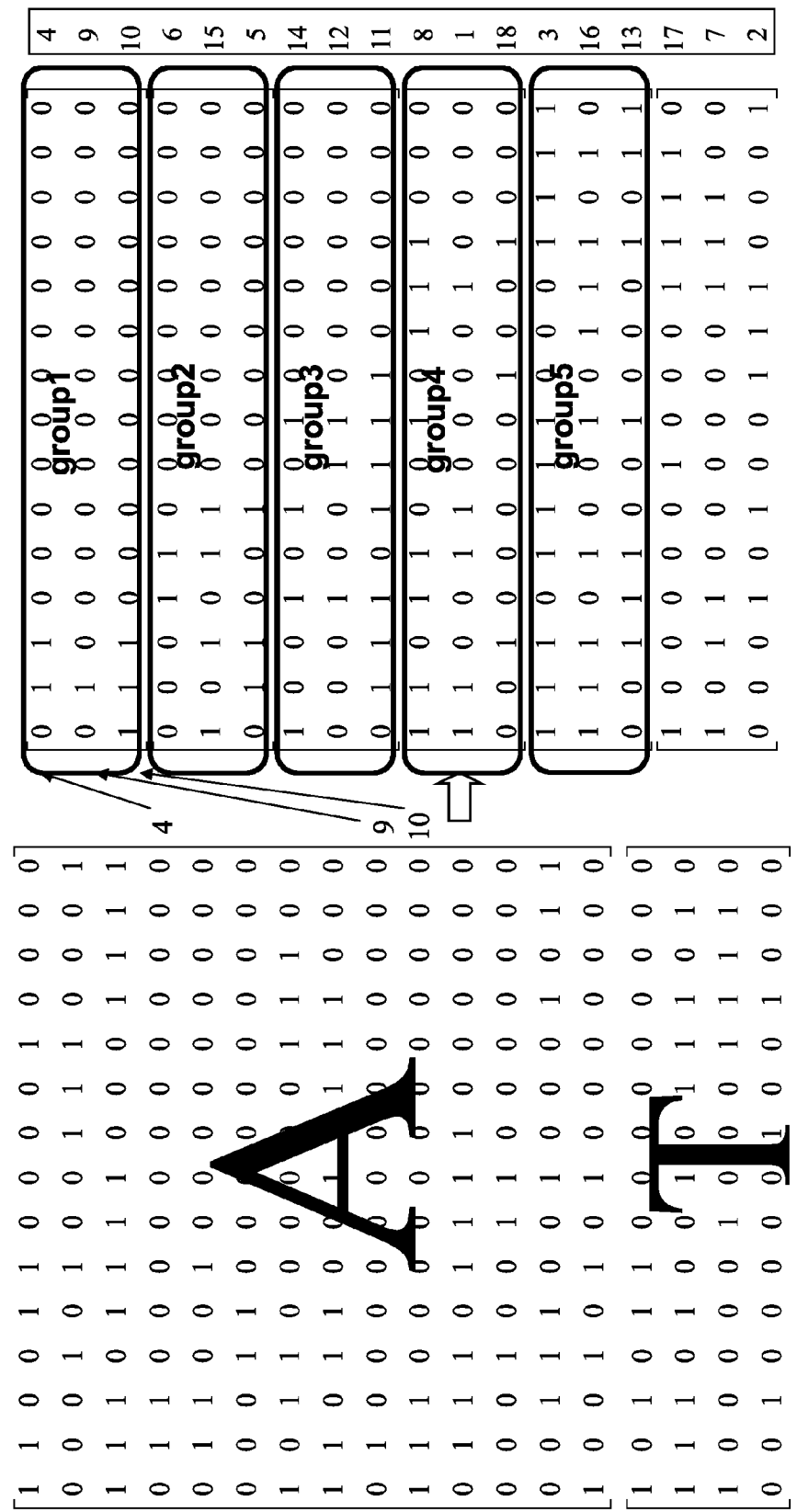
FIG. 4 shows a first pre-processing stage according to one embodiment of the disclosure, wherein an encoding matrix A and a triple vector T are grouped.

FIG. 4 shows the first pre-processing operation of the area Gaussian elimination operation according to one embodiment of the disclosure, wherein an encoding matrix A and a triple vector T are grouped and the grouping result may be referred as a grouped decoding matrix. First, among the complete encoding matrix A and the triple vector T, three rows each having "1" in the first three columns are chosen as a first group (for generating identity matrix). In other embodiment, the three rows having most "0" s may be chosen as the first group. Alternatively, in still another embodiment, the first group may be chosen based on a combination of the above two implementations. The following groups are grouped based on this principle and thus one or more rows may be not chosen into groups. For example, in FIG. 4, the fourth row, the ninth row and the tenth row are chosen as a first group (group 1). From FIG. 4, it is clear that in choosing the first group, "1" s occur in the first three columns and the last 12 columns are all "0" s. Similarly, in choosing the second group (group 2), "1" s occur in the first 6 columns and the last 9 columns are all "0" s. By so, the encoding matrix A and the triple vector T are grouped into a matrix C (which is also called "encoded symbol generation matrix").

As shown in FIG. 4, based on the above grouping policy, the first group includes the fourth row, the ninth row and the tenth row; the second group includes the sixth row, the fifteenth row and the fifth row; the third group includes the fourteenth row, the twelfth row and the eleventh row; the fourth group includes the eighth row, the first row and the eighteenth row; and the fifth group includes the third row, the sixteenth row and the thirteenth row. The other rows which are not chosen into groups are arranged in the bottom of the matrix C.

Figure 5:
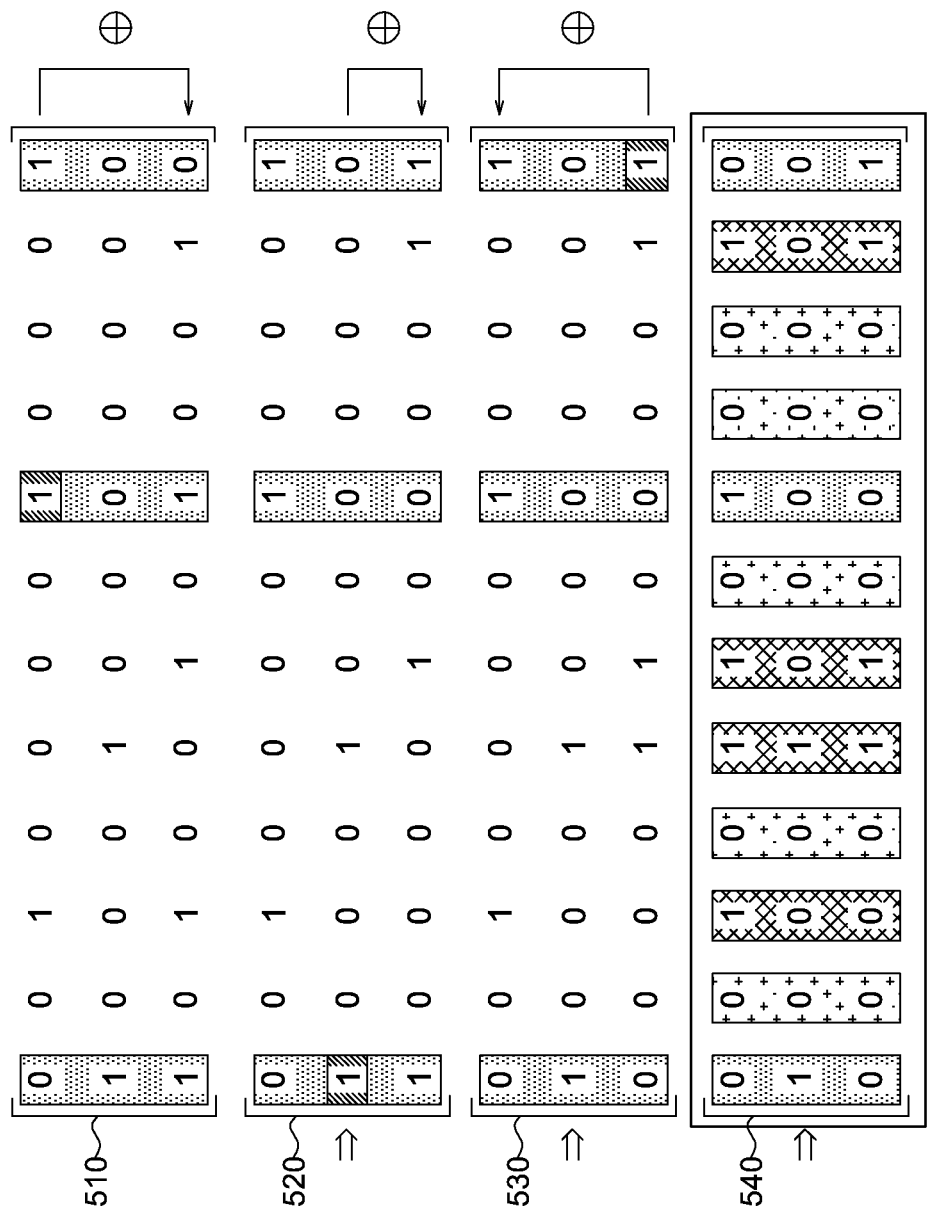
FIG. 5 shows a second pre-processing stage according to one embodiment of the disclosure, wherein an area Gaussian elimination is performed on a group row vector of the grouping result of FIG. 4.

Now how to perform the area Gaussian elimination operation for making three columns of the group row vector as an identity matrix is described. FIG. 5 shows the second pre-processing operation according to one embodiment of the disclosure, wherein an area Gaussian elimination is performed on a group row vector of the grouping result of FIG. 4. Three columns of the group row vector 510 are chosen as an identity matrix. Here, the first column, the eighth column and the twelfth column are chosen. The first row of the row vector 510 is XOR to the third row of the row vector 510 for eliminating "1" in the eighth column of the third row, which obtains row vector 520. The second row of the row vector 520 is XOR to the third row of the row vector 520 to eliminate "1" in the first column of the third row, which obtains the row vector 530. The third row of the row vector 530 is XOR to the first row of the row vector 530 to eliminate "1" in the twelfth column of the first row, which obtains the row vector 540. In the row vector 540, the first column, the eighth column and the twelfth column each includes a single "1" which is used in transforming into the identity matrix. In other embodiment, after the area Gaussian elimination is performed on the first group in FIG. 4, the first column, the second column and the third column each includes a single "1" and an identity matrix is obtained, as shown in FIG. 6.

As shown in FIG. 5, the group parameters are as follows. The encoded group row vector is the row vector 540; the encoded group operation (OP) list is [[1,3], [2,3], [3,1]]; and the encoded group column list is [[8,1,12], [2,4,7,9,10], [3,5,6,11]]. [8,1,12] refers to the rows which may be transformed into an identity matrix; [2,4,7,9,10] refers to the rows which are formed by only "0"; and [3,5,6,11] refers to the remaining rows. FIG. 5 shows the group parameters for a single group. For example, FIG. 4 shows five groups and thus the whole group parameters include the respective group parameters of the five groups.

Figure 6:
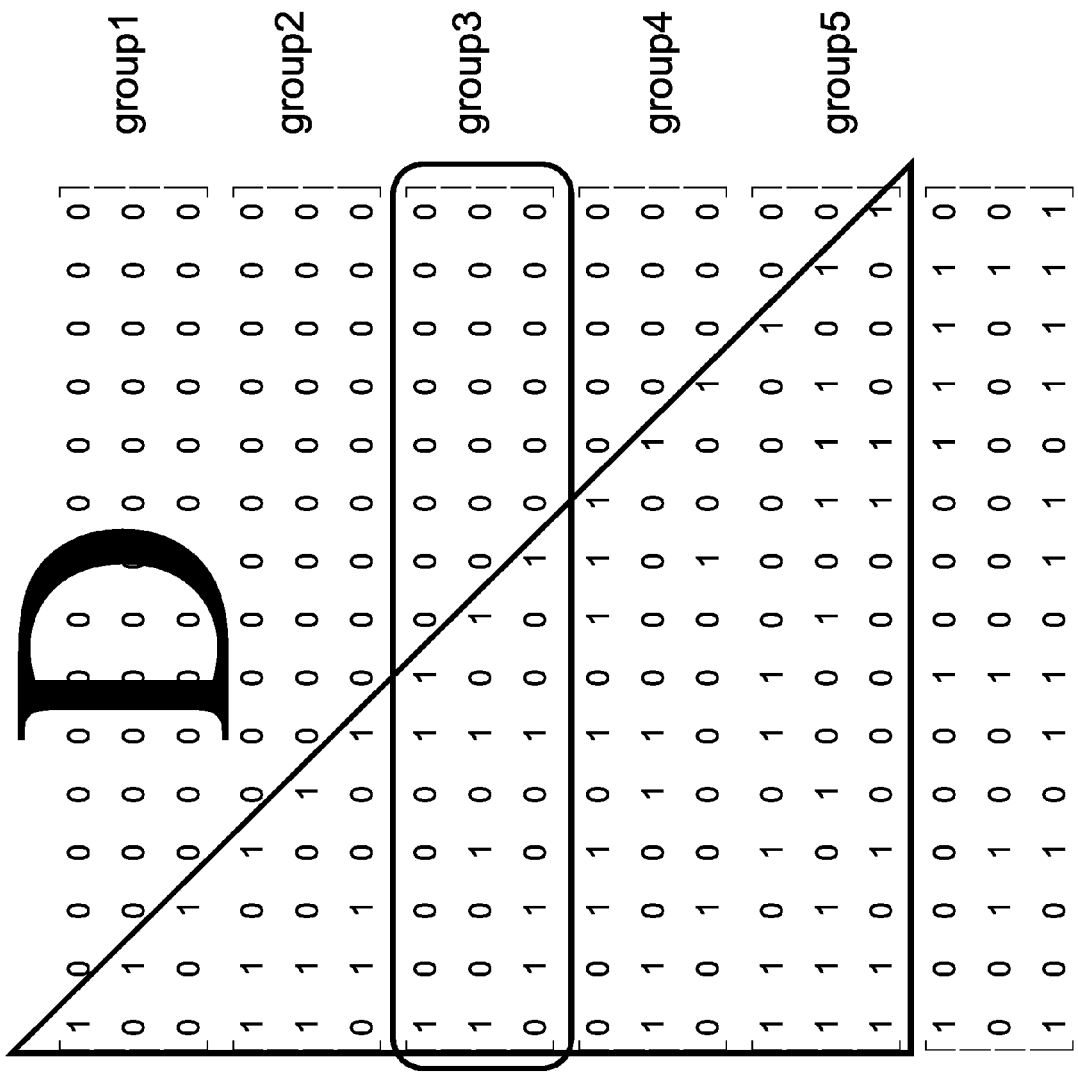
FIG. 6 shows a third pre-processing stage according to one embodiment of the disclosure, which shows that a lower triangular matrix D is obtained by performing an area Gaussian elimination on all group row vectors of the grouping result of FIG. 4.

Row vectors which are obtained by performing the area Gaussian elimination operation of FIG. 5 on each of the groups (group 1~group 5) of the matrix C of FIG. 4 are combined into a lower triangular matrix D as shown in FIG. 6. It is easy to transform the lower triangular matrix D into an identity matrix. FIG. 6 shows a third pre-processing operation according to one embodiment of the disclosure, which shows a lower triangular matrix D obtained by performing an area Gaussian elimination on the complete group row vectors in FIG. 4.

Further, the row vectors (i.e. the seventeenth row, the seventh row and the second row) which are not chosen into the groups are not processed by the area Gaussian elimination operation. Besides, in performing the area Gaussian elimination operation in FIG. 4~FIG. 6, the receiver 150 does not receive the received encoded symbols ES' yet, but the receiver 150 has to know the number of the source symbols in advance for knowing the contents of the encoding matrix A and the triple vector T in advance. That is, after the receiver 150 knows the number of the source symbols, the receiver 150 may perform the operations of FIG. 4~FIG. 6 in advance to transform the encoded matrix A and the triple vector T into the lower triangular matrix D.

In other words, in the embodiment, in performing the area Gaussian elimination operation, the selected columns in the selected row vector is processed by the regular Gaussian elimination operation to transform the column vector in the selected row vector into a matrix which is to be transformed into an identity matrix via column exchange. Besides, in performing the regular Gaussian elimination operation, row operations are also performed on the rows in the selected row vector.

Now, the decoding of the receiver 150 is described. After the receiver 150 receives the received encoded symbols ES', the receiver 150 loads the corresponding group parameters described above.

The encoded equation matrix generating module 155 of the group-based pre-decoding module 154 of the receiver 150 transforms the received encoded symbols ES' into the encoded equation matrix EEM, and the details are described in the following. In the following description, the encoded symbols $ES_3$ and $ES_{16}$ are lost as an example.

Figure 7:
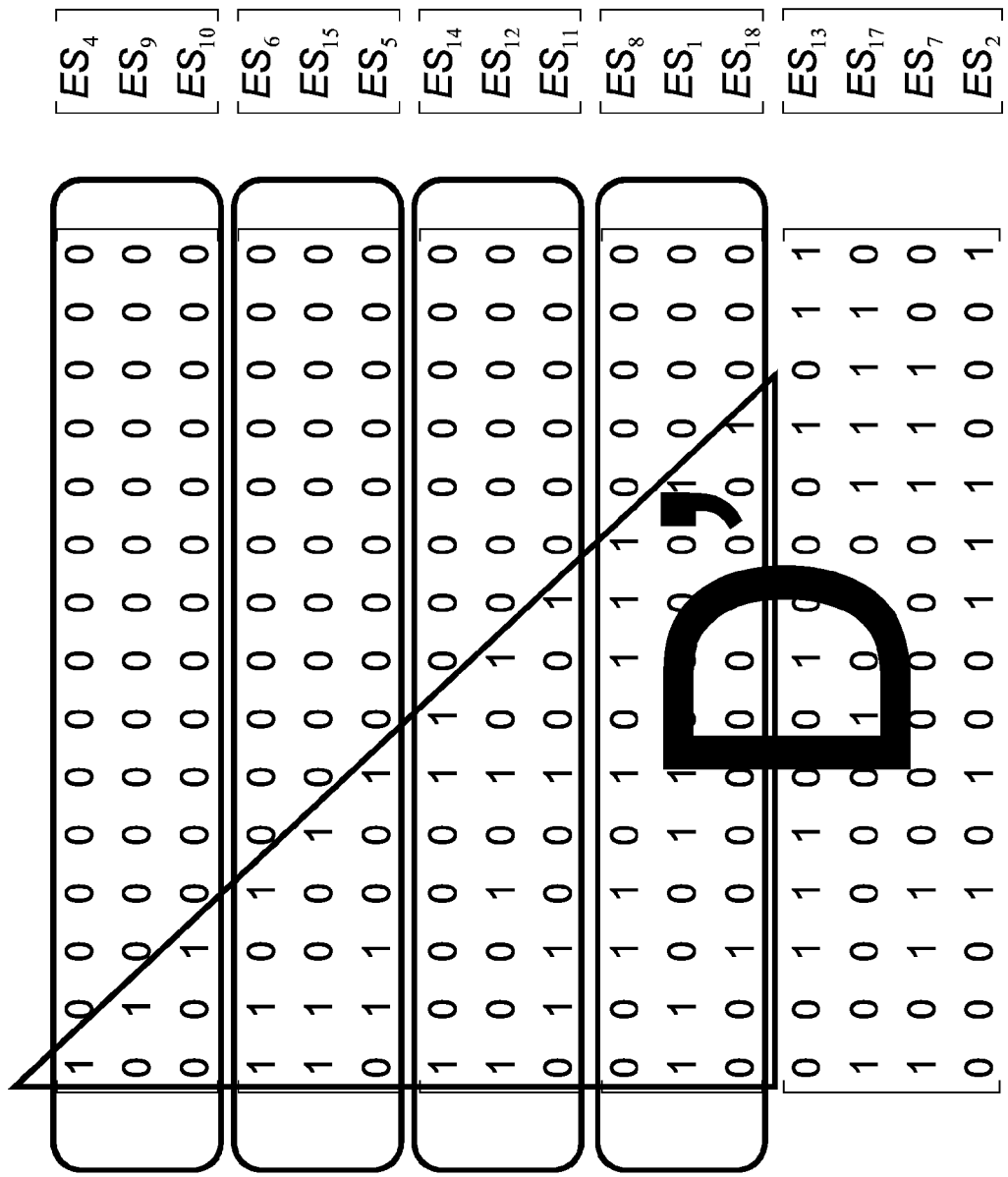
FIG. 7 shows a matrix obtained by reordering the encoded symbols ES in position and loading group parameters of complete groups according to one embodiment of the disclosure.

From FIG. 4, the encoded symbols $ES_3$ and $ES_{16}$ are in the fifth group (group 5). The receiver 150 receives the first group to the fourth group in complete. Thus, in the matrix D of FIG. 6, the thirteenth row (corresponding to $ES_3$) and the fourteenth row (corresponding to $ES_{16}$) of the fifth group are removed but the fifteenth row of the fifth group is kept. In other words, the encoded row vectors corresponding to the first group to the fourth groups are placed into the first to the twelfth rows of the encoded equation matrix EEM, and other rows (corresponding to other encoded symbols) of the encoded matrix A and the triple vector T are placed into the thirteenth row to the sixteenth row. That is, other encoded symbols are encoded symbols $ES_{13}$, $ES_{17}$, $ES_7$ and $ES_2$, and the bottom four rows of the matrix C in FIG. 4 are chosen as the thirteenth row to the sixteenth row of the encoded equation matrix EEM. In FIG. 7, $ES_4$~$ES_{18}$ and the corresponding first row to the twelfth row are complete groups; and $ES_{13}$~$ES_2$ and the corresponding thirteenth row to the sixteenth row are incomplete groups.

The received encoded symbols ES' are reordered based on the grouping policy. In other words, the encoded symbols $ES_1$~$ES_{18}$ are reordered in the sequence of $ES_4$, $ES_9$, $ES_{10}$, ..., $ES_7$ and $ES_2$ (from top to bottom) based on the right side in FIG. 4. The transformed matrix D' is as shown in FIG. 7. FIG. 7 shows a matrix obtained by reordering the encoded symbols ES and loading group parameters of complete groups according to one embodiment of the disclosure.

Figure 8:
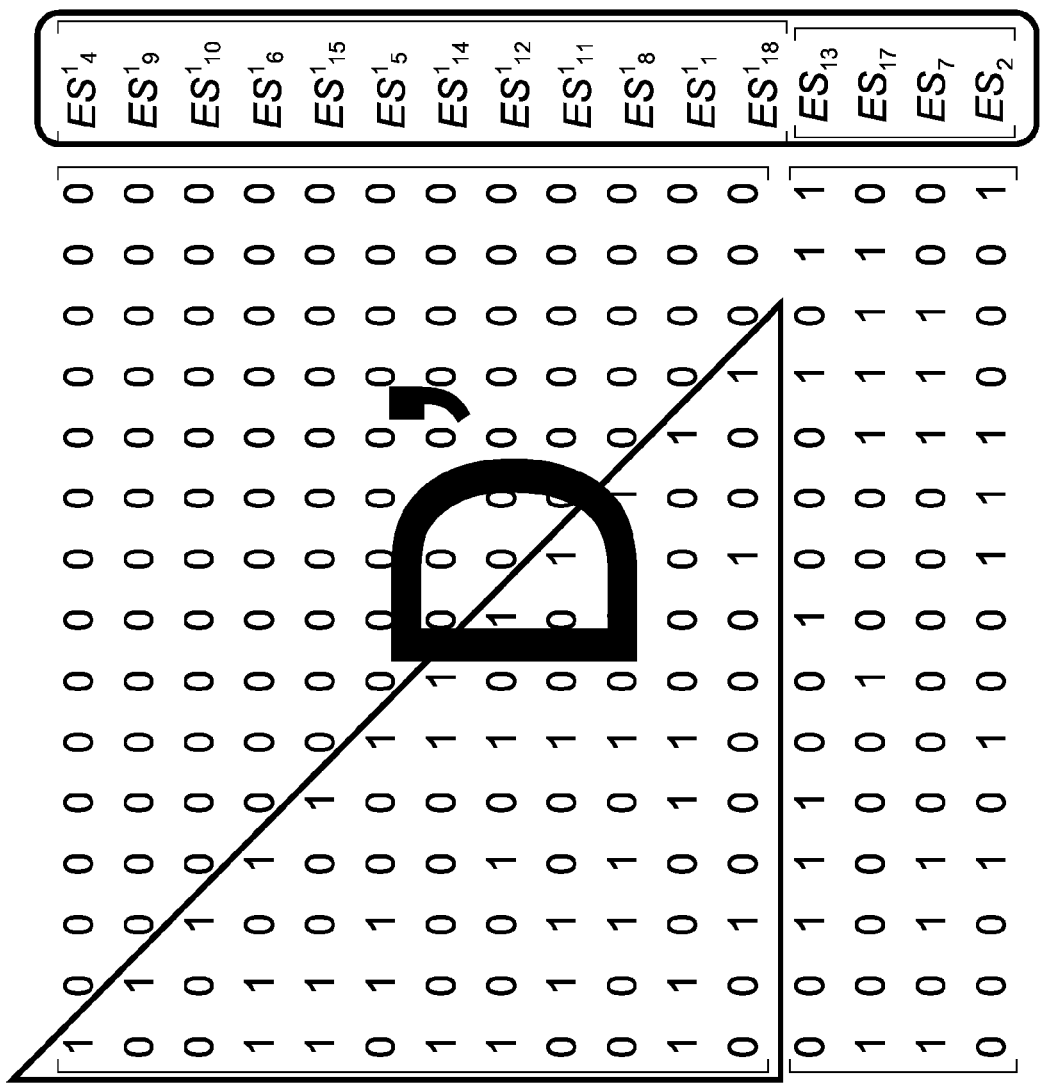
FIG. 8 shows a matrix obtained by performing XOR operations on encoded symbols ES of the complete groups according to one embodiment of the disclosure, wherein XOR operations are performed on neither the encoded symbols ES of incomplete groups nor the encoded symbols ES of remaining groups.

Based on the encode group operation list of the group parameters, XOR operations are performed on the encoded symbols ES of the complete group but not on the encoded symbols ES of the incomplete group, as shown in FIG. 8. If the area Gaussian elimination operation is performed on the first group by the operation list [[1,3], [2,3] [3,1]], then XOR operations are performed on $ES_4$, $ES_9$ and $ES_{10}$ of the first group in this sequence. In details, $ES_4$ is added (i.e. XOR) to $ES_{10}$; then $ES_9$ is added to $ES_{10}$; and then $ES_{10}$ is added to $ES_4$ to obtain $ES^1_4$, $ES^1_9$ and $ES^1_{10}$. The similar operations are performed on the encoded symbols ES of the second group to the fourth group but not on the encoded symbols ES of the incomplete group. The matrix obtained as shown in FIG. 8 is referred as the encoded equation matrix EEM which includes the matrix D' and the symbols $ES^1$ (or ES).

Described are details about how the grouped Gaussian elimination module 157 performs a grouped Gaussian elimination on the encoded equation matrix EEM to recover the intermediate symbols IMS. Now refer to FIG. 9~FIG. 11.

Figure 9:
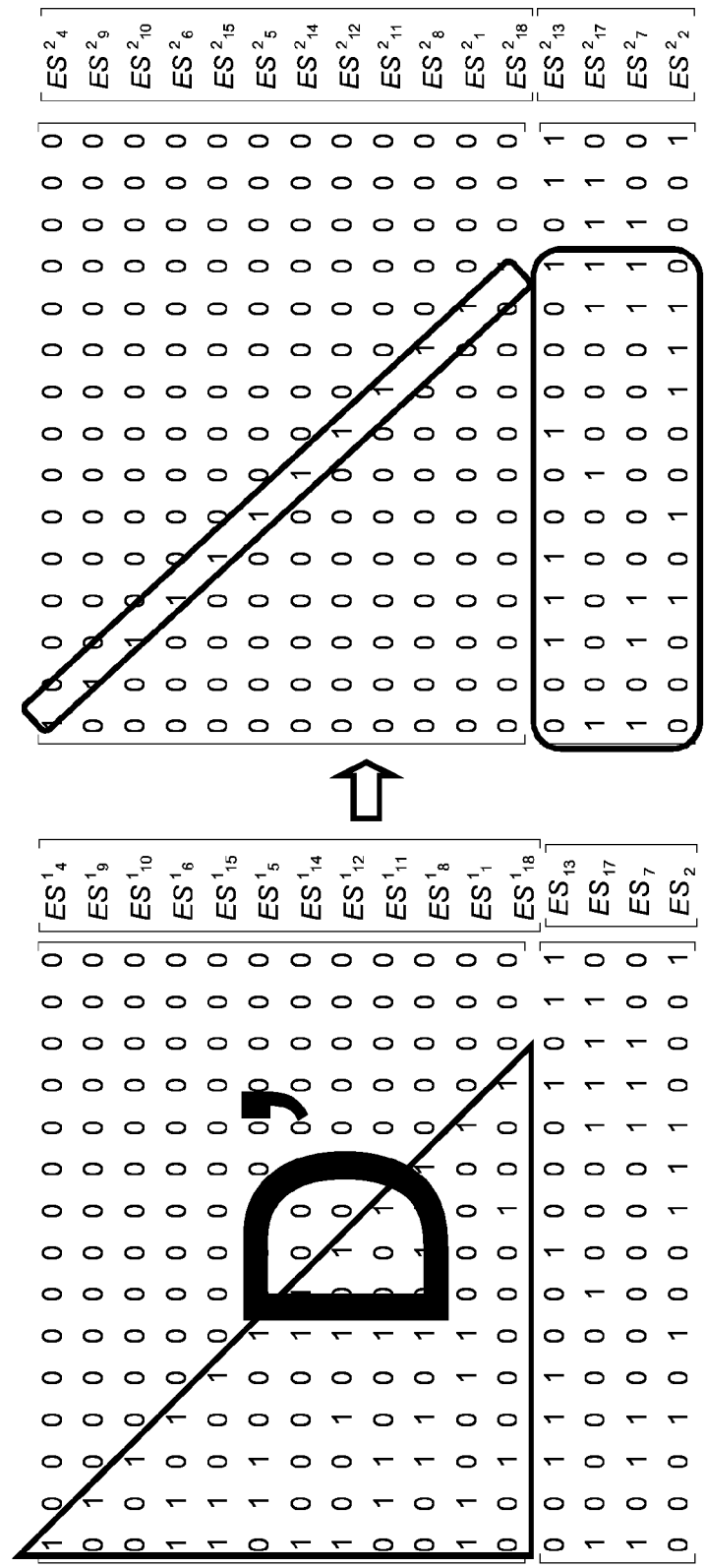
FIG. 9 shows transforming the lower triangular matrix of the matrix D' into an identity matrix.

FIG. 9 shows transforming the lower triangular matrix of the matrix D' into an identity matrix. For example, in order to eliminate "1" in the first and second columns of the fourth row of the matrix D', the first row is added to the fourth row and the second row is added to the fourth row. Thus, the fourth row includes a single "1" (in the fourth column). These operations are also performed on the symbols $ES^1$. In other words, $ES^1_4$ is added (XOR) to $ES^1_6$ and $ES^1_9$ is added (XOR) to $ES^1_6$. Thus, the obtained result is $ES^2_6=(ES^1_4)XOR(ES^1_6)XOR(ES^1_9)$.

Other operations are similar. Besides, the above operations are not performed on the bottom fourth rows since the bottom four rows are not related to transformation of the identity matrix. For simplicity, the symbols ES on the bottom fourth rows are marked as $ES^2$ (i.e. $ES^2_{13}=ES_{13}$, $ES^2_{17}=ES_{17}$, $ES^2_7=ES_7$, $ES^2_2=ES_2$).

Figure 10:
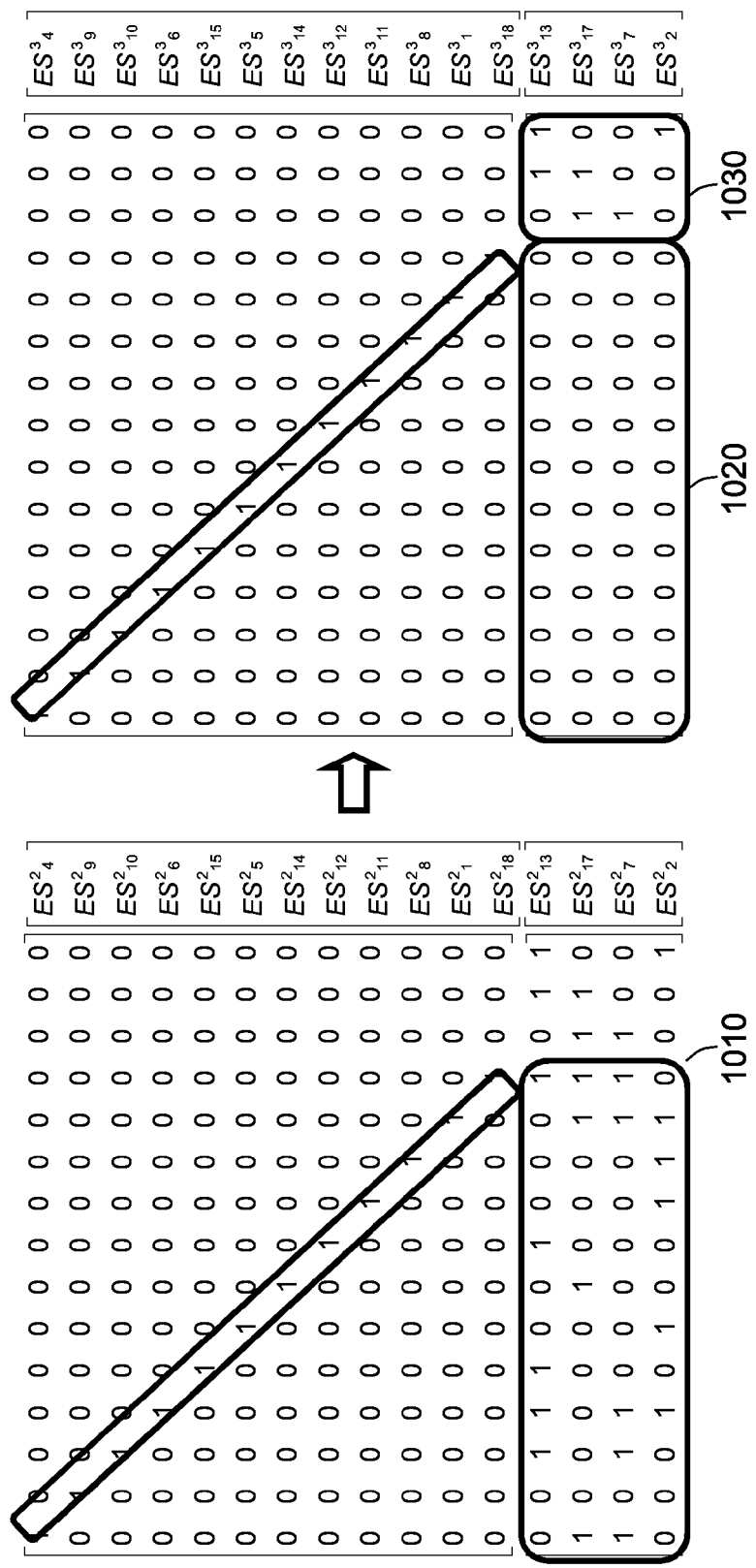
FIG. 10 shows elimination of the low row vectors of the matrix D' by the upper identity units of the matrix of FIG. 9.

FIG. 10 shows a result of eliminating the lower row vectors of the matrix D' by the upper identity units of the matrix obtained as FIG. 9. "1" s in the row vector 1010 are all eliminated and the elimination result is shown as the row vector 1020. The row vector 1030 refers to the remaining part of the thirteenth to the sixteenth rows. Similarly, the same operations are performed on the symbols $ES^2$ to obtain the symbols $ES^3$. For example, in order to eliminate all "1" s in the fourteenth row (i.e. the second row of the row vector 1010) of the matrix D', the first row, the seventh row, the eleventh row and the twelfth row are added (XOR) to the fourteenth row and the result is $ES^3_{17}=(ES^2_4)XOR(ES^2_{14})XOR(ES^2_1)XOR(ES^2_{18})XOR(ES^2_{17})$.

Figure 11:
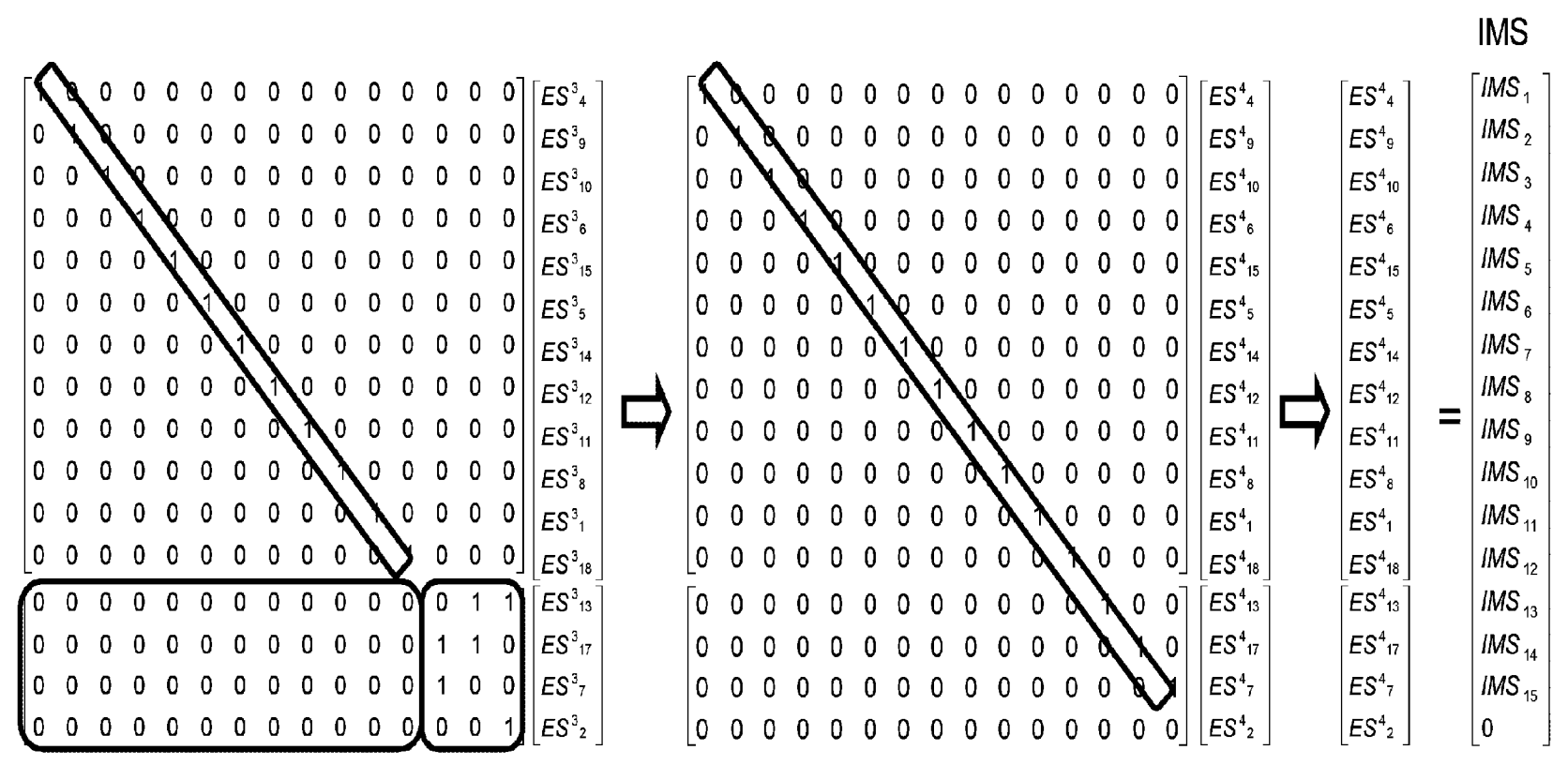

FIG. 11 shows elimination of the right-bottom of the matrix in FIG. 10 by a general Gaussian elimination. After the row vector 1030 is transformed, the matrix D' is transformed into an identity matrix. Similarly, when the Gaussian elimination is performed on the rows, the Gaussian elimination is also performed on the corresponding symbols $ES^3$. Thus, the obtained symbols $ES^4$ are the intermediate symbols IMS.

Figure 12:
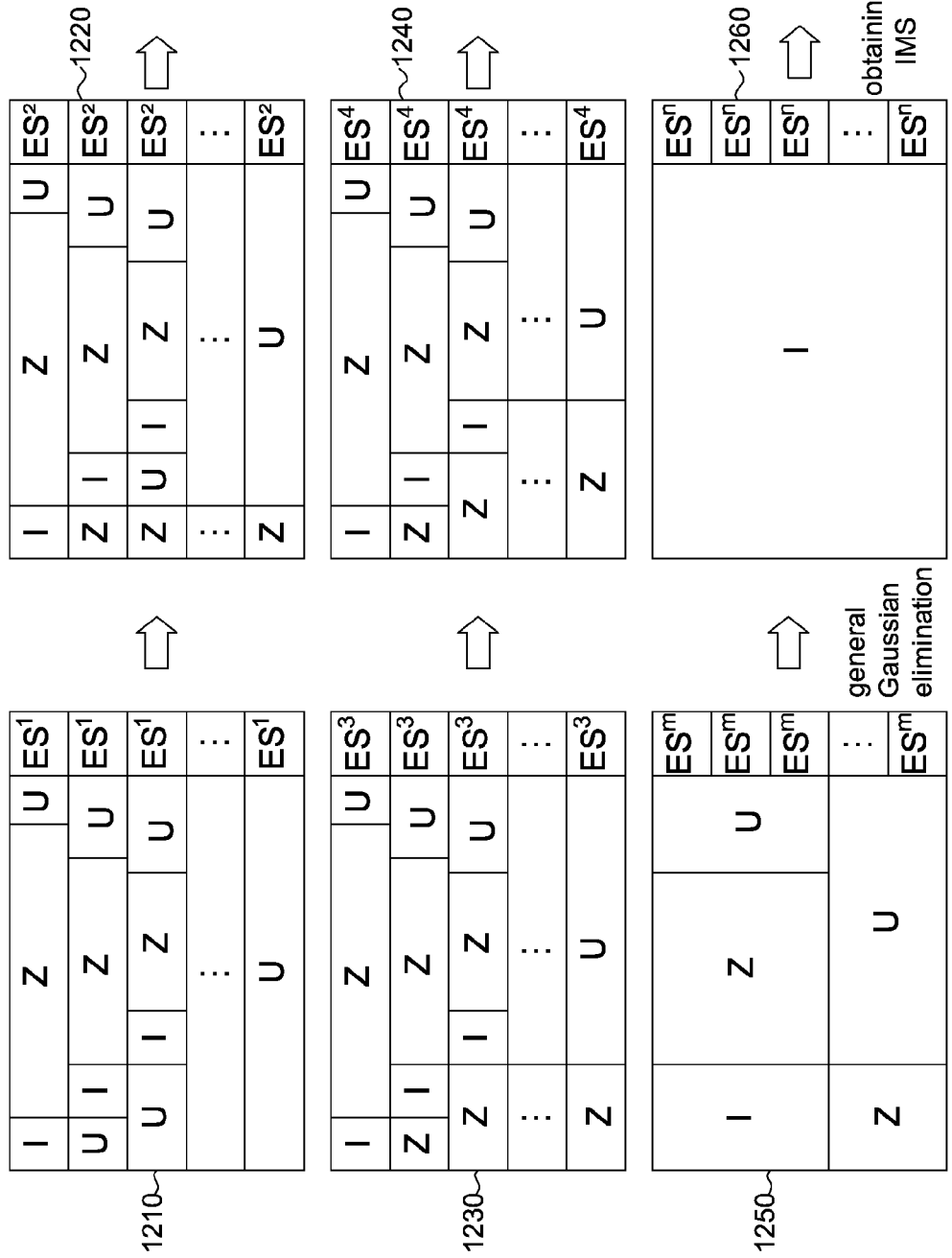
FIG. 12 shows operation of the grouped Gaussian elimination according to one embodiment of the disclosure.

As described above, in the embodiment of the disclosure, in grouped Gaussian elimination, the upper identity matrix is used to eliminate the lower matrix. A general Gaussian elimination is performed on the remaining rows of the matrix (for example, the row vectors 1010~1030 of FIG. 10) to recover the intermediate symbols IMS. Details of the grouped Gaussian elimination are shown in FIG. 12. FIG. 12 shows operation of the grouped Gaussian elimination according to one embodiment of the disclosure. In FIG. 12, "I" refers to an identity matrix, "Z" refers to a zero matrix (which is formed by all "0" s); "U" refers to a matrix which may be neither the identity matrix nor the zero matrix; and "$ES^i$" refers to the encoded symbols ES after i-th operations.

The matrix 1210 is the encoded equation matrix EEM (as shown in FIG. 8). The identity matrix I in the first group of the matrix 1210 is used to eliminate the lower matrix to transform the matrix U below the identity matrix I into the zero matrix Z and thus the matrix 1220 is obtained. Similarly, the identity matrix I in the second group is used to eliminate and transform the lower matrix into the zero matrix Z and thus the matrix 1230 is obtained. Similarly, the matrixes 1240, 1250 and so on are obtained. After the identity matrixes of the upper groups are used to eliminate the lower matrix U, the matrix 1250 is obtained. The general Gaussian elimination operation is performed on the remaining matrix U of the matrix 1250 to obtain the identity matrix I (as shown in FIG. 11). The symbols ES″ obtained by the above operations are the intermediate symbols IMS (i.e. the intermediate symbols IMS are recovered). Of course, in performing the Gaussian elimination operations on the matrixes, the Gaussian elimination operations are also performed on the corresponding symbols ES.

Details about how the source symbol reconstructing module 159 reconstructs the source symbols SS from the intermediate symbols IMS are not specified here.

Besides, in the embodiment, each of the groups includes the same number of encoded symbols ES. However, in other embodiment of the disclosure, the number of the encoded symbols ES in the groups may be different, which is still within the spirit of the disclosure.

The grouping policy of the embodiment of the disclosure may include at least a rateless mode or a fixed-rate mode. In the rateless mode, there are two grouping implementation, wherein in the first grouping implementation, the source symbols SS and the repair symbols RS are independently grouped; and in the second grouping implementation, the source symbols SS and a part of the repair symbols RS are mixed grouped while the remaining repair symbols RS are independently grouped.

In the fixed-rate mode, if the sender may send data in the form of the source symbols SS (i.e. the sender does not have to pack the source symbols SS into packets), then the source symbols SS and the repair symbols RS are mixed grouped. If the sender does not send data in the form of the source symbols SS (i.e. the sender has to pack the source symbols SS into packets), then the repair symbols RS are independently grouped.

Besides, in the embodiment of the disclosure, the group length may be generated by a group length generation module (which is not shown in the figures). The group length generation module generates the group length based on an upper threshold of the block length parameter k and a packet loss rate. The length of each group may be different from each other. The block length parameter k refers to a number of the encoded symbols ES of the data. In the above example, k=14.

Figure 13:
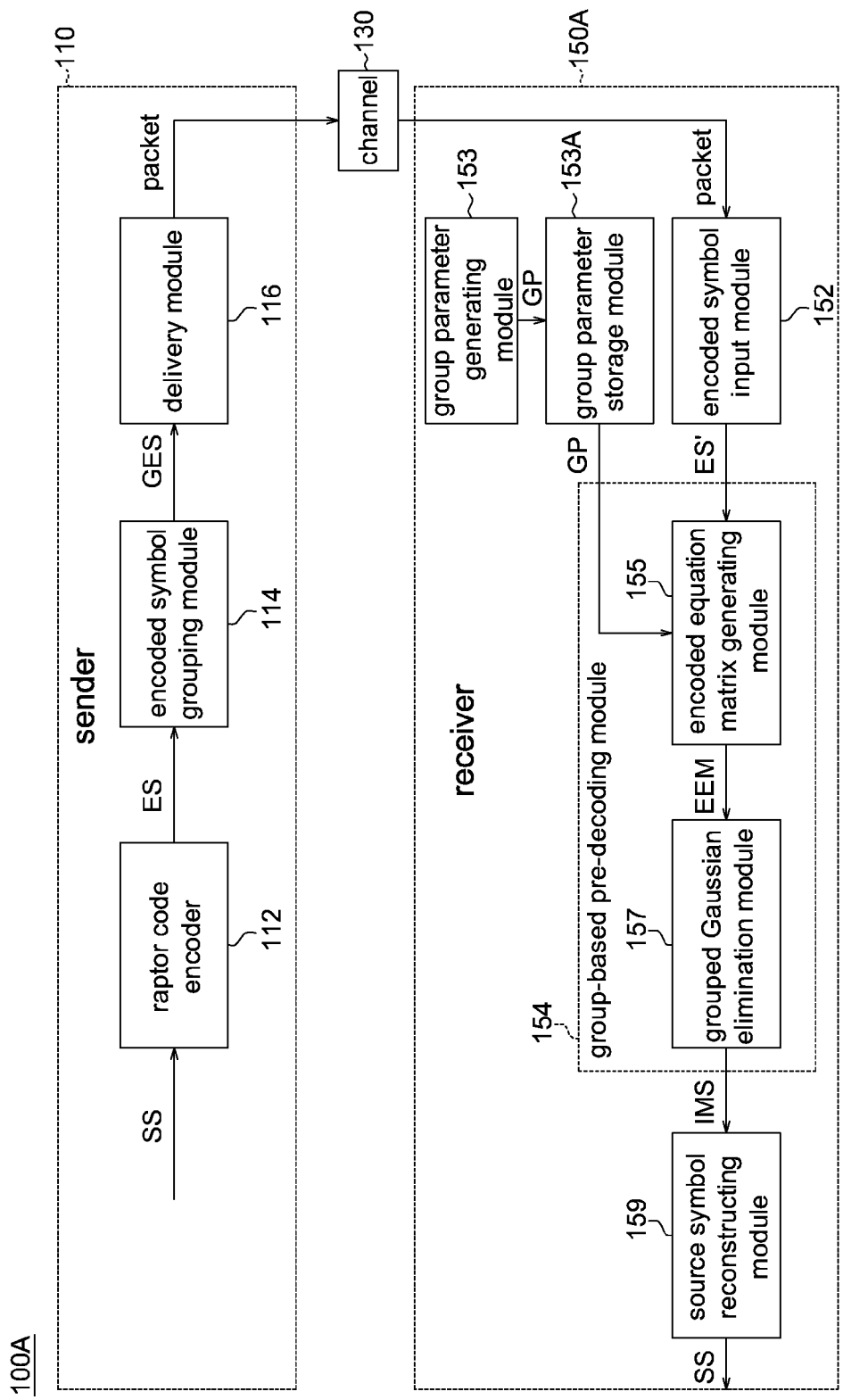
FIG. 13 shows a functional block diagram of a communication system according to another embodiment of the disclosure.

In another embodiment of the disclosure, the receiver 150A may further include a group parameter storage module 153A, as shown in FIG. 13. FIG. 13 shows a functional block diagram of a communication system according to another embodiment of the disclosure. In the communication system 100A of FIG. 13, the group parameter storage module 153A is used for storing the group parameters generated by the group parameter generating module 153. The group parameter storage module 153A receives the parameter k and determines whether any stored group parameter GP is corresponding to the parameter k. If yes, then the group parameter storage module 153A sends the group parameter to the encoded equation matrix generating module 155. If no, then the group parameter storage module 153A notifies the group parameter generating module 153 to generate a group parameter GP corresponding to the parameter k. After the group parameter storage module 153A receives the group parameter GP (corresponding to the parameter k) from the group parameter generating module 153, the group parameter storage module 153A sends the group parameter to the encoded equation matrix generating module 155.

From the above description, in the embodiment of the disclosure, before decoding, the receiver groups the encoded matrix A and the triple vector T (as shown in FIG. 4) and performs an area Gaussian elimination operation on the grouping result to generate the group parameter (as shown in FIG. 5) and the lower triangular matrix (as shown in FIG. 6). In the pre-decoding of the receiver, the received encoded symbols ES' are reordered based on the grouping result (as shown in FIG. 7) and constructs the encoded equation matrix EEM by the group parameter (as shown in FIG. 8). A grouped Gaussian elimination is performed on the encoded equation matrix EEM (as shown in FIG. 9~FIG. 11) to obtain the intermediate symbols IMS (as shown in FIG. 11). The source symbols SS are obtained by reconstructing the intermediate symbols IMS.

Figure 14A:
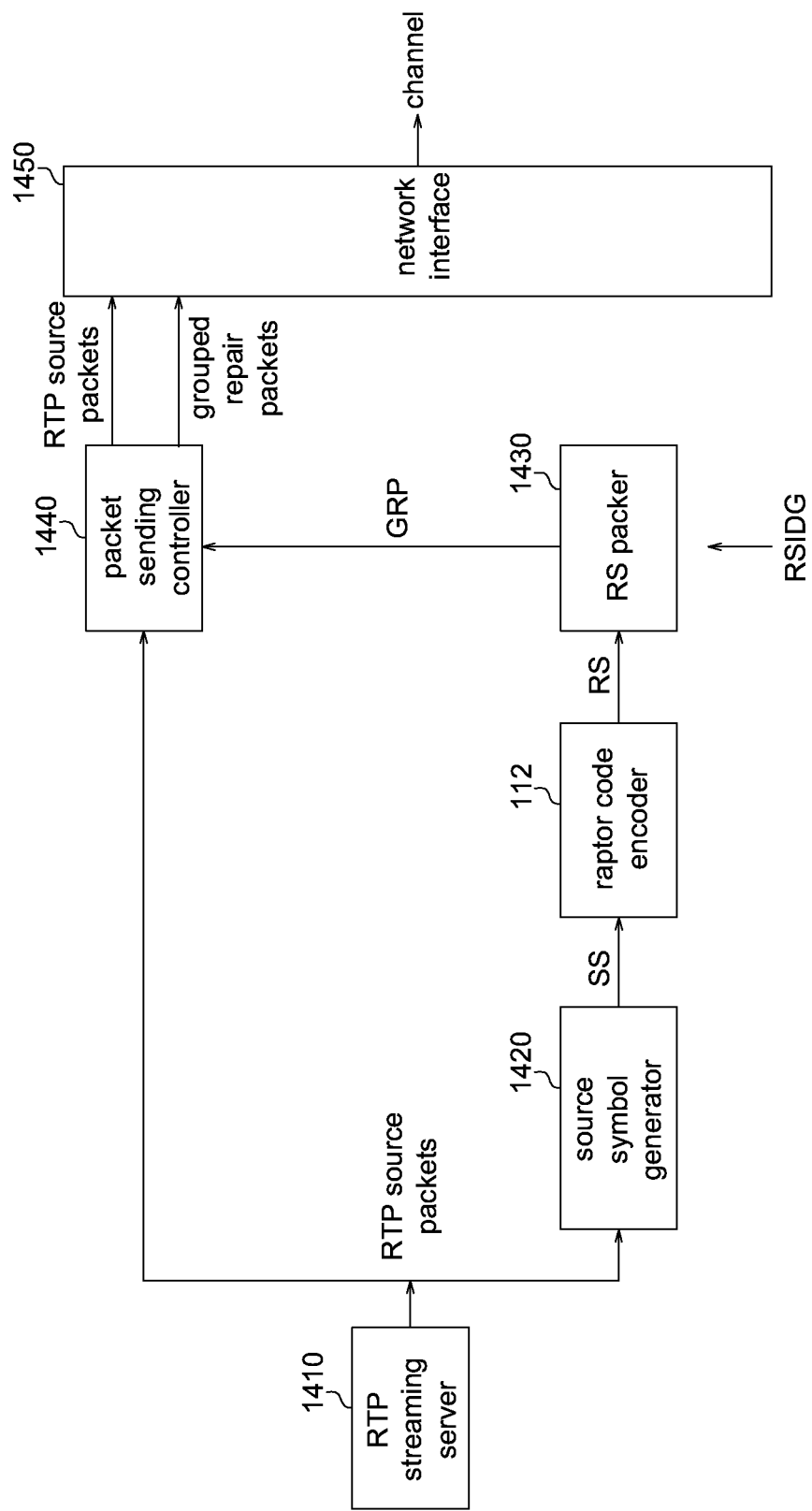
FIGS. 14A-17 show functional block diagrams of senders and receivers according to other embodiments of the disclosure.
Figure 14B:
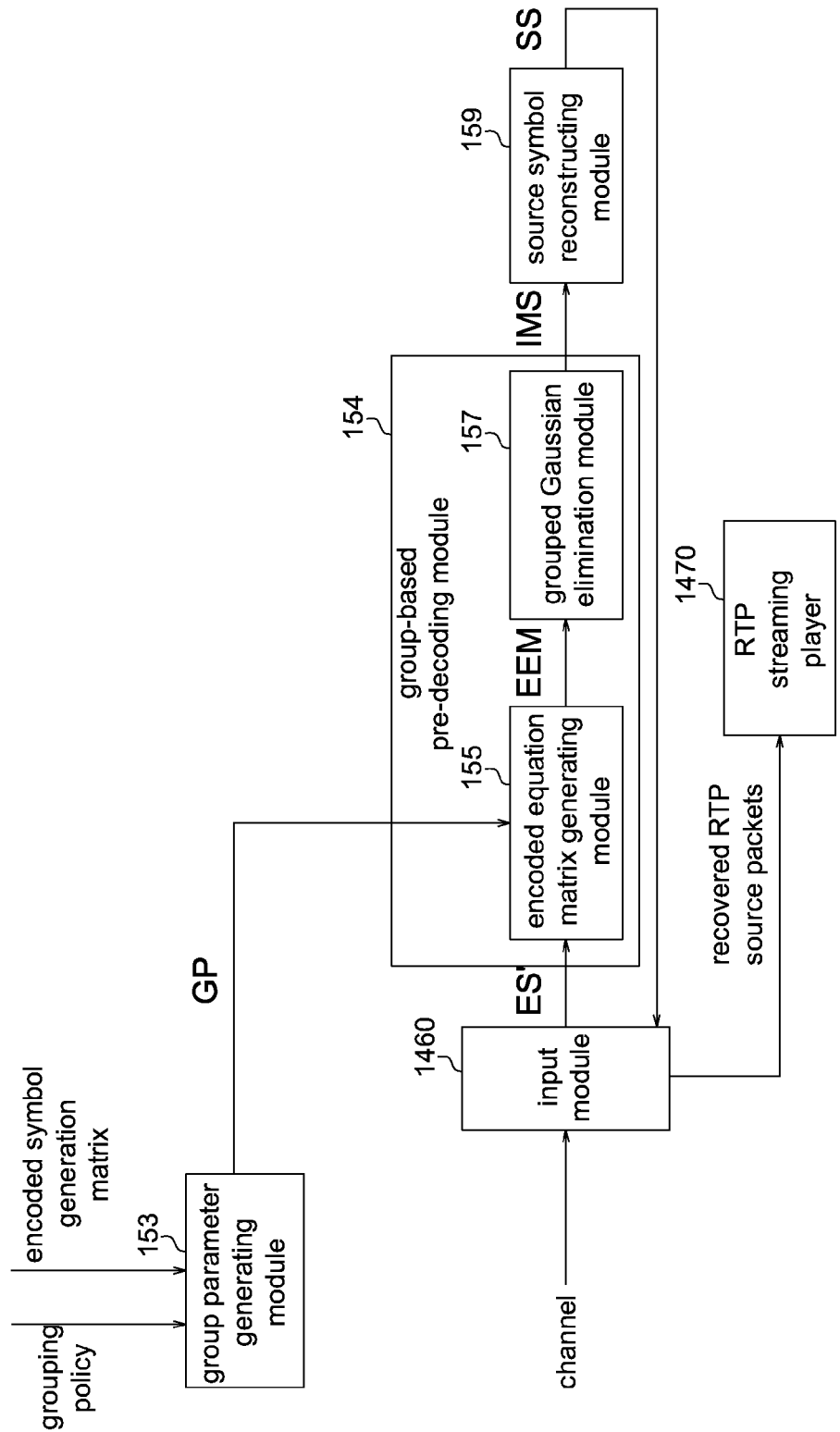

FIGS. 14A and 14B show functional block diagrams of a sender and a receiver according to another embodiment of the disclosure. Refer to FIGS. 14A and 14B. The sender of FIG. 14A and the receiver of FIG. 14B may be used for data sending and receiving RTP (read-time transport protocol) data. As shown in FIG. 14A, the RTP streaming server 1410 sends the RTP source packets (which may be general RTP packets or packets formed by adding additional data into the general RTP packets) to the source symbol generator 1420 and the packet sending controller 1440. The source symbol generator 1420 transforms the RTP source packets into the source symbols SS. Based on RS ID group information RSIDG, the RS packer 1430 groups the repair symbols RS of the same source block into grouped repair packets GRP to send to the packet sending controller 1440. The packet sending controller 1440 sends the RTP source packets and the grouped repair packets GRP onto the channel via the network interface 1450. For example, the packet sending controller 1440 sends the grouped repair packets GRP in unit of group.

Now refer to FIG. 14B. The input module 1460 receives data (including the RTP source packets and the repair packets) from the sender via the channel. If the received data does not have any loss, then the input module 1460 may transfer the received data to the RTP streaming player 1470. If the number of the received data is lower than the decoding requirement, then the input module 1460 does not send data to the group-based pre-decoding module 154. On the contrary, if the number of the received data is equal to the decoding requirement or higher than the decoding requirement, then the input module 1460 sends data to the group-based pre-decoding module 154 for recovering the intermediate symbols IMS. After the source symbol reconstructing module 159 reconstructs the intermediate symbols IMS into the source symbols SS, the source symbol reconstructing module 159 sends the source symbols SS to the input module 1460. The input module 1460 sends the source symbols SS to the RTP streaming player 1470.

Figure 15:
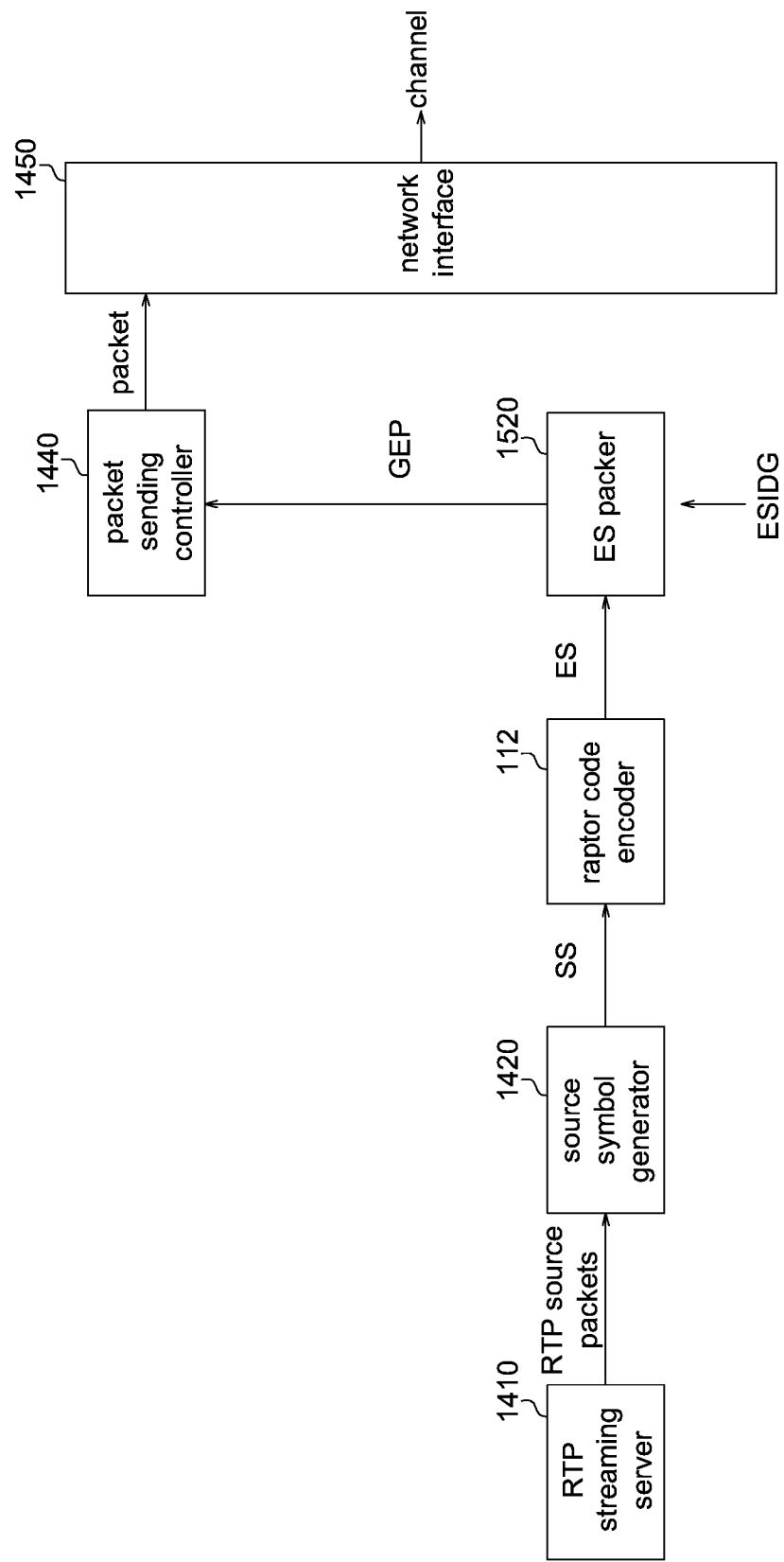

FIG. 15 shows a functional block of the sender according to another embodiment of the application. The sender in FIG. 15 is also applicable to sending RTP data. Different from FIG. 14A, in FIG. 15, the RTP streaming server 1410 does not send the RTP source packets onto the channel, but sends to the source symbol generator 1420. The source symbol generator 1420 transforms the received RTP source packets into a format supported by the raptor code encoder 112. The raptor code encoder 112 generates the encoded symbols ES. Similarly, based on ES ID group information ESIDG, the ES packer 1520 groups and packs the encoded symbols ES of the same group into grouped encoded packets GEP. The source symbols SS and the repair symbols RS may be independently or mixed grouped.

The ES packer 1520 sends the grouped encoded packets GEP in groups to the packet sending controller 1440. The receiver in FIG. 14B may be also used for receiving data from the sender of FIG. 15.

Figure 16A:
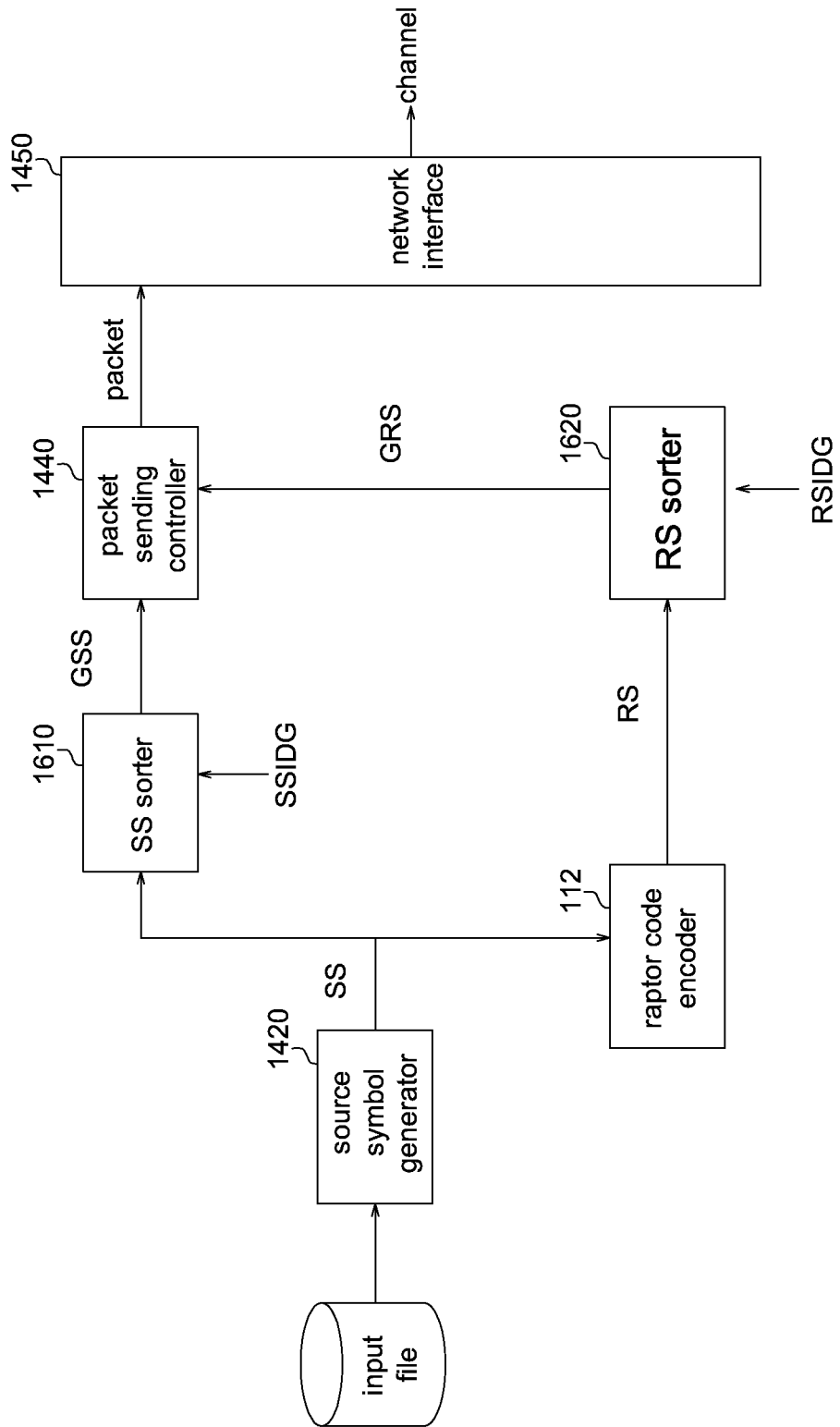
Figure 16B:
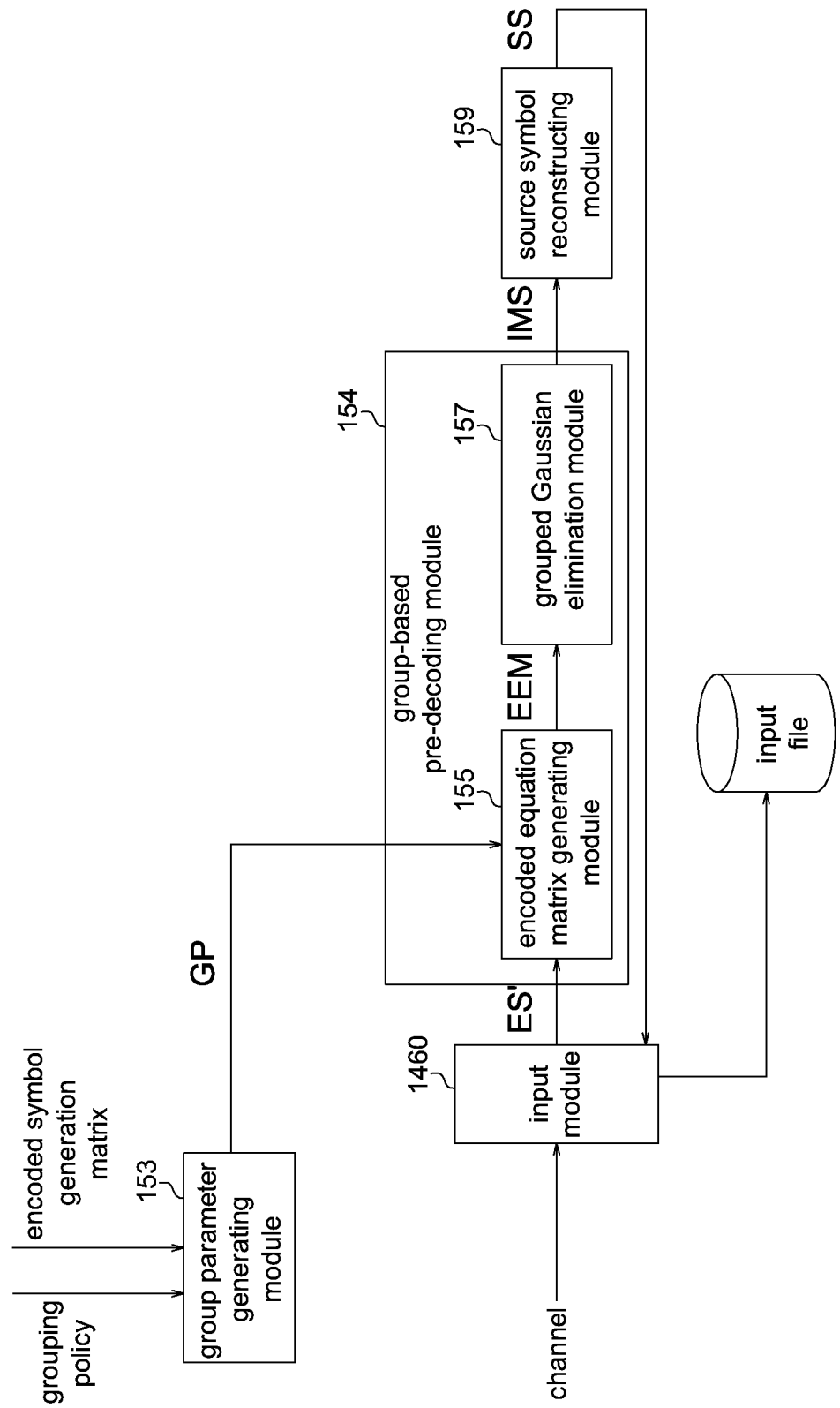

Now refer to FIGS. 16A and 16B which shows functional block diagrams of the sender and the receiver according to another embodiment of the application. The sender of FIG. 16A and the receiver of FIG. 16B may be used for sending and receiving FLUTE (file delivery over unidirectional transport) data. As shown in FIG. 16A, the source symbol generator 1420 transforms the input file into the source symbols SS which are accepted by the raptor code encoder 112. Based on source symbol ID group information SSIDG, the source symbol sorter 1610 groups the source symbols of the same block into the grouped source symbols GSS and sends to the packet sending controller 1440 based on the grouping policy.

Similarly, based on the repair symbol ID group information RSIDG, the RS sorter 1620 groups the repair symbols RS of the same block into the grouped repair symbols GRS for sending to the packet sending controller 1440. The packet sending controller 1440 packs the grouped source symbols GSS and the grouped repair symbols GRS into FLUTE packets. Therefore, in FIG. 16A, the source symbols SS and the repair symbols RS are grouped independently.

Similarly, in the receiver of FIG. 16B, if the received data is lossless, then the input module 1460 may sends the received data (as complete data) to the following stages. If the number of the received data is lower than the decoding requirements, then the input module 1460 does not send data to the group-based pre-decoding module 154. On the contrary, if the number of the received data is equal to the decoding requirement or higher than the decoding requirements, then the input module 1460 sends data to the group-based pre-decoding module 154 for recovering the intermediate symbols IMS. After the source symbol reconstructing module 159 reconstructs the intermediate symbols IMS into the source symbols SS, the source symbol reconstructing module 159 sends the source symbols SS to the input module 1460 and the input module 1460 sends the source symbols SS as the input file to the following stages.

Figure 17:
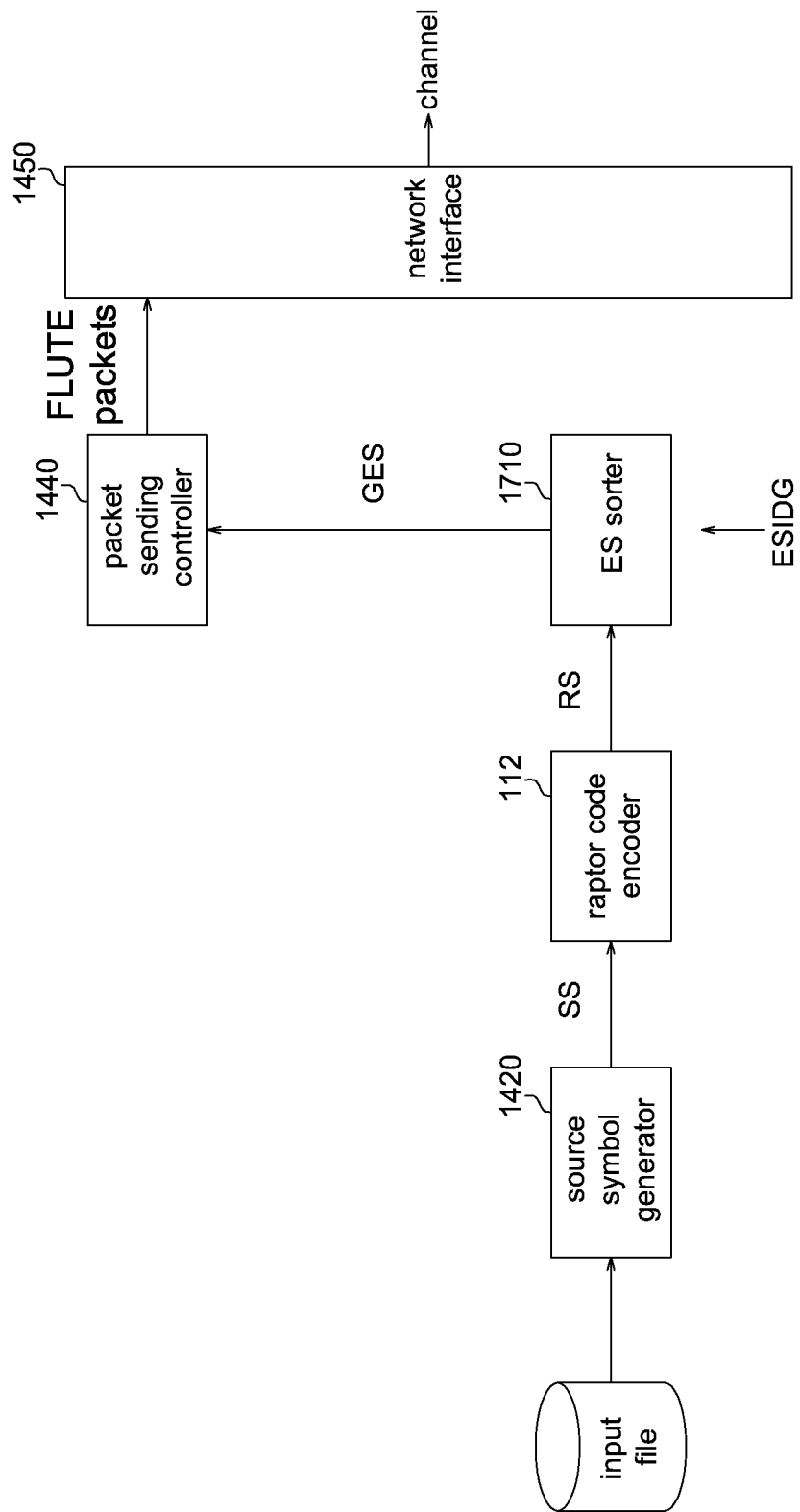

Now refer to FIG. 17 which shows the functional block diagram of the sender according to another embodiment of the disclosure. The sender of FIG. 17 may be used for sending FLUTE data. Different from FIG. 16A, in the sender of FIG. 17, the source symbols SS and the repair symbols RS are mixed grouped. That is, based on the encoded symbol ID group information ESIDG, the ES sorter 1710 groups the encoded symbols ES of the same source block into the grouped encoded symbols GES and sends in groups to the packet sending controller 1440.

The sender of FIG. 17 may operate with the receiver of FIG. 16B. That is, the receiver of FIG. 16B may receive FLUTE packets from the sender of FIG. 17.

The sender/receiver of FIG. 16A, FIG. 16B and FIG. 17 are for file sending/receiving. Thus, data received by the receiver are either complete or enough for being recovered into complete files. This is because if parts of the file were lost, this file is not able to be utilized. The embodiments of the disclosure may be used for receiving/sending video data; and even if a part of the video data received has lost, the user may still watch or listen the audio/video data.

In the embodiments of the disclosure, if enough number of the received encoded symbols ES' are received, then the group Gaussian elimination operation may start for accelerating decoding.

Still further, in the embodiments of the disclosure, the group parameter generating module may receive a grouping policy and the encoded symbol generating matrix (for example, the matrix C in FIG. 4). After the group parameter generating module receives the grouping policy, only one kind of grouping result is obtained (that is to say, there is only one way to group the encoded symbols ES).

Further, in the embodiments of the disclosure, the grouping result may be overlapped or non-overlapped. The non-overlapped grouping result refers to that the encoded symbol ES is in a single group; and the overlapped grouping result refers to that the encoded symbol ES may be in two or more groups.

The encoded equation matrix generating module 155 and the grouped Gaussian elimination module 157 may be used to solve the non-overlapped grouping result. When the encoded equation matrix generating module 155 arranges the row vectors of the groups, the encoded equation matrix generating module 155 determines whether the leading coefficient of two or more rows are overlapped or not wherein the leading coefficient refers to the first "1" of the row. If the leading coefficient of one row is at the second column and the leading coefficient of another row is also at the second column, then the leading coefficients of these two rows are overlapped. If yes, then only one of the rows whose leading coefficients are overlapped is kept for solving the non-overlapped grouping result. In performing grouped Gaussian elimination, if the grouped Gaussian elimination module 157 determines that the leading coefficients of the row vector is eliminated as "0", then the row vector is removed for solving the non-overlapped grouping result.

From the above description, in the embodiments of the disclosure, the decoding may be accelerated by that (1) the group parameters may be calculated in advance as long as the block length parameter is known and (2) the calculated group parameters may be used for accelerating Gaussian elimination operation.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A receiver for a communication system, comprising:
an input module, for receiving signals via a channel to thereby obtain received data;
a group-based pre-decoding module, for combining the received data received by the input module with a grouped decoding matrix to obtain an encoded equation matrix based on a group parameter, and for performing a group operation on the encoded equation matrix; and
a reconstructing module, for reconstructing the encoded equation matrix obtained from the group operation into output data, wherein
the group-based pre-decoding module combines encoded symbols of the received data with rows of a decoding matrix based on the group parameter, the decoding matrix being grouped into a plurality of complete groups and/or an incomplete group, and
if one of the complete groups becomes incomplete due to a lost encoded symbol, other rows of the one of the complete groups which becomes incomplete are moved into the incomplete group.

2. The receiver according to claim 1, further comprising:
a group parameter generating module, for grouping the decoding matrix into the grouped decoding matrix based on a block length of input data, and for performing an area operation to generate the group parameter,
wherein the input data is received as the received data by the input module.

3. The receiver according to claim 2, wherein:
the decoding matrix includes an encoded matrix and a triple vector each including a plurality of rows; and
the group parameter generating module is for grouping based on number of "0" of respective rows of the encoded matrix and the triple vector to group the decoding matrix into the complete groups and/or the incomplete group.

4. The receiver according to claim 3, wherein:
the group parameter generating module is for performing the area operation on the complete groups of the decoding matrix into a lower triangular matrix; and
the group parameter generating module skips the area operation on the incomplete group.

5. The receiver according to claim 4, wherein the group parameter includes:
a group identification (ID) for representing a respective ID of the complete groups;
an encoded symbol ID for identifying which encoded symbols of the received data are included in each of the complete groups;
an encoded group row vectors for recording row vectors obtained by performing the area operation on the complete groups of the decoding matrix;
an encoded group operation (OP) list for recording a list of operations used in the area operation performed on the complete groups of the decoding matrix; and
an encoded group column list for recording a result of rearranging columns of the complete groups of the decoding matrix.

6. The receiver according to claim 5, wherein:
the group-based pre-decoding module includes an encoded equation matrix generating module for combining the encoded symbols of the received data with the rows of the decoding matrix based on the group parameter; and
if one of the encoded symbols of the received data is lost, a corresponding row of the decoding matrix is removed.

7. The receiver according to claim 6, wherein:
the encoded equation matrix generating module is for performing on the encoded symbols of the complete groups based on the encoded group operation list of the group parameter, but skipping the encoded symbols of the incomplete group, to obtain the encoded equation matrix.

8. The receiver according to claim 7, wherein:
the group-based pre-decoding module includes a grouped Gaussian elimination module for transforming the complete groups of the encoded equation matrix into an identity matrix and for performing corresponding operation on the encoded symbols corresponding to the complete groups;
the grouped Gaussian elimination module is for eliminating a part of the incomplete group by the identity matrix and for performing corresponding operations on the encoded symbols corresponding to the incomplete group;
the grouped Gaussian elimination module is for eliminating other part of the incomplete group by a general Gaussian elimination operation and for performing corresponding operation on the encoded symbols corresponding to the incomplete group, to obtain a plurality of intermediate symbols; and
the reconstructing module is for reconstructing the intermediate symbols into the output data.

9. The receiver according to claim 2, further comprising:
a group parameter storage module, for storing and outputting the group parameter to the group-based pre-decoding module,
wherein if the group parameter storage module determines that the group parameter corresponding to the block length of the input data is not stored in the group parameter storage module, then the group parameter storage module notifies the group parameter generating module to generate the group parameter.

10. A communication method, comprising:
grouping a decoding matrix into a plurality of complete groups and/or an incomplete group based on a block length of input data;
performing an area operation on the grouped decoding matrix for generating a group parameter, based on the block length of the input data;
combining received data with the grouped decoding matrix to obtain an encoded equation matrix based on the group parameter, combining encoded symbols of the received data with rows of the decoding matrix based on the group parameter, and if one of the complete groups becomes incomplete due to a lost encoded symbol, moving other rows of the one of the complete groups which becomes incomplete into the incomplete group; and
performing a group operation on the encoded equation matrix and reconstructing the encoded equation matrix obtained from the group operation into output data,
wherein the input data is received as the received data via a channel.

11. The communication method according to claim 10, wherein
the decoding matrix includes an encoded matrix and a triple vector each including a plurality of rows; and
step of grouping the decoding matrix includes:
grouping the decoding matrix into the complete groups and/or the incomplete group, based on number of "0" of respective rows of the encoded matrix and the triple vector.

12. The communication method according to claim 11, further comprising:
performing the area operation on the complete groups of the decoding matrix into a lower triangular matrix; and
skipping the area operation on the incomplete group.

13. The communication method according to claim 12, wherein the group parameter includes:
a group identification (ID) for representing a respective ID of the complete groups;
an encoded symbol ID for identifying which encoded symbols of the received data are included in each of the complete groups;
an encoded group row vectors for recording row vectors obtained by performing the area operation on the complete groups of the decoding matrix;
an encoded group operation (OP) list for recording a list of operations used in the area operation performed on the complete groups of the decoding matrix; and
an encoded group column list for recording a result of rearranging columns of the complete groups of the decoding matrix.

14. The communication method according to claim 13, further comprising:

if one of the encoded symbols of the received data is lost, removing a corresponding row of the decoding matrix.

15. The communication method according to claim 14, further comprising:
performing on the encoded symbols of the complete groups based on the encoded group operation list of the group parameter, but skipping the encoded symbols of the incomplete group, to obtain the encoded equation matrix.

16. The communication method according to claim 15, further comprising:
transforming the complete groups of the encoded equation matrix into an identity matrix and performing corresponding operation on the encoded symbols corresponding to the complete groups;
eliminating a part of the incomplete group by the identity matrix and performing corresponding operations on the encoded symbols corresponding to the incomplete group;
eliminating other part of the incomplete group by a general Gaussian elimination operation and performing corresponding operation on the encoded symbols corresponding to the incomplete group, to obtain a plurality of intermediate symbols; and
reconstructing the intermediate symbols into the output data.

17. A communication system, comprising:
a sender, for grouping and sending a plurality of contents of input data based on a block length of the input data; and
a receiver, for receiving received data from the sender, comprising:
a group-based pre-decoding module, for combining the received data with a grouped decoding matrix to obtain an encoded equation matrix based on a group parameter, and for performing a group operation on the encoded equation matrix; and
a reconstructing module, for reconstructing the encoded equation matrix obtained from the group operation into output data; wherein
the group-based pre-decoding module combines encoded symbols of the received data with rows of a decoding matrix based on the group parameter, the decoding matrix being grouped into a plurality of complete groups and/or an incomplete group, and
if one of the complete groups becomes incomplete due to a lost encoded symbol, other rows of the one of the complete groups which becomes incomplete are moved into the incomplete group.

18. The communication system according to claim 17, wherein
the receiver further comprises a group parameter generating module, for grouping the decoding matrix into the grouped decoding matrix based on the block length of the input data, and for performing an area operation to generate the group parameter;
the decoding matrix includes an encoded matrix and a triple vector each including a plurality of rows;
the group parameter generating module is for grouping based on number of "0" of respective rows of the encoded matrix and the triple vector to group the decoding matrix into the complete groups and/or the incomplete group;
the group parameter generating module is for performing the area operation on the complete groups of the decoding matrix into a lower triangular matrix; and
the group parameter generating module skips the area operation on the incomplete group.

19. The communication system according to claim 18, wherein
the group-based pre-decoding module includes an encoded equation matrix generating module for combining the encoded symbols of the received data with the rows of the decoding matrix based on the group parameter;
if one of the encoded symbols of the received data is lost, a corresponding row of the decoding matrix is removed; and
the encoded equation matrix generating module is for performing on the encoded symbols of the complete groups based on the encoded group operation list of the group parameter, but skipping the encoded symbols of the incomplete group, to obtain the encoded equation matrix.

20. The communication system according to claim 19, wherein
the group-based pre-decoding module includes a grouped Gaussian elimination module for transforming the complete groups of the encoded equation matrix into an identity matrix and for performing corresponding operation on the encoded symbols corresponding to the complete groups;
the grouped Gaussian elimination module is for eliminating a part of the incomplete group by the identity matrix and for performing corresponding operations on the encoded symbols corresponding to the incomplete group;
the grouped Gaussian elimination module is for eliminating other part of the incomplete group by a general Gaussian elimination operation and for performing corresponding operation on the encoded symbols corresponding to the incomplete group, to obtain a plurality of intermediate symbols; and
the reconstructing module is for reconstructing the intermediate symbols into the output data.

* * * * *